United States Patent
Yasunami et al.

(10) Patent No.: US 7,351,515 B2
(45) Date of Patent: *Apr. 1, 2008

(54) POSITIVE RESIST COMPOSITION AND PATTERN-FORMING METHOD USING THE SAME

(75) Inventors: Shoichiro Yasunami, Shizuoka (JP); Kenji Wada, Shizuoka (JP); Kunihiko Kodama, Shizuoka (JP); Kenichiro Sato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/941,822

(22) Filed: Sep. 16, 2004

(65) Prior Publication Data
US 2005/0064326 A1   Mar. 24, 2005

(30) Foreign Application Priority Data
Sep. 19, 2003 (JP) .................... P. 2003-328063
Sep. 24, 2003 (JP) .................... P. 2003-331457

(51) Int. Cl.
*G03F 7/039* (2006.01)
*G03F 7/20* (2006.01)
*G03F 7/30* (2006.01)

(52) U.S. Cl. .................. 430/270.1; 430/326; 430/914; 430/921; 430/925; 430/905; 430/910

(58) Field of Classification Search ............ 430/270.1, 430/921, 925, 326
See application file for complete search history.

(56) References Cited

U.S. PATENT DOCUMENTS 6,855,476 B2 * 2/2005 Ferreira et al. .......... 430/270.1
2002/0076649 A1 * 6/2002 Kumon et al. ........... 430/271.1
2004/0234888 A1 * 11/2004 Lamanna ................. 430/270.1
2005/0095532 A1 * 5/2005 Kodama et al. ......... 430/270.1

FOREIGN PATENT DOCUMENTS

| EP | 1179750 A1 * | 2/2002 |
| JP | 9-309874 | * 12/1997 |
| JP | 10-326015 A | 12/1998 |
| JP | 11-84639 A | 3/1999 |
| WO | WO 02/082185 A1 * | 10/2002 |

OTHER PUBLICATIONS

Machine-assisted English translation of JP 9-309874, provided by JPO.*

* cited by examiner

*Primary Examiner*—Sin Lee
(74) *Attorney, Agent, or Firm*—Sughrue Mion, PLLC

(57) ABSTRACT

A positive resist composition includes:
(A) a resin capable of increasing a solubility thereof in an alkali developer by an action of an acid;
(B) a compound capable of generating a sulfonic acid represented by the following formula (I) upon irradiation with one of an actinic ray and a radiation; and
(C1) at least one of an amine compound having at least an aliphatic hydroxyl group in a molecule and an amine compound having at least an ether bond in a molecule:

$$A_1\text{-}(A_2\text{-}SO_3H)_n \quad (I)$$

wherein $A_1$ represents an n-valent linking group, $A_2$ represents a single bond or a divalent aliphatic group, and $A_2$'s each may be the same or different, provided that at least one group represented by $A_1$ or $A_2$ contains a fluorine atom, and n represents an integer of from 2 to 4.

9 Claims, No Drawings

POSITIVE RESIST COMPOSITION AND PATTERN-FORMING METHOD USING THE SAME

This application is based on Japanese Patent application JP 2003-328063 filed Sep. 19, 2003, and JP 2003-331457 field Sep. 24, 2003, the entire contents of which are hereby incorporated by reference.

BACKGROUND OF THE INVENTION

1. Technical Field of the Invention

The invention relates to a positive resist composition the property of which changes by the reaction upon irradiation with an actinic ray or radiation. More specifically, the invention relates to a positive resist composition for use in the manufacturing processes of semiconductors, e.g., IC, circuit substrates, e.g., liquid crystals and thermal heads, and for use in other photo-fabrication processes.

2. Description of the Related Art

Chemical amplification positive resist compositions are pattern-forming materials of generating an acid at the area irradiated with radiation, e.g., far ultraviolet rays, changing the solubility of the irradiated area with the actinic radiation and that of the non-irradiated area in a developer by the reaction with the acid as a catalyst, and forming a pattern on a substrate.

When a KrF excimer laser is used as the exposure light source, since resins having poly(hydroxystyrene) as a fundamental skeleton small in absorption in the area of 248 nm are mainly used, a high sensitivity, high resolution and good pattern is formed as compared with conventionally used naphthoquinonediazide/novolak resins.

On the other hand, when a light source of shorter wavelength, e.g., an ArF excimer laser (193 nm), is used as the light source, even chemical amplification resists are not sufficient, since compounds containing an aromatic group substantially show large absorption in the region of 193 nm.

Accordingly, resists containing a resin having an alicyclic hydrocarbon structure have been developed for an ArF excimer laser. In general, in the process using these chemical amplification resists, the reaction is advanced and completed by pattern exposure and post-exposure baking (hereinafter abbreviated to "PEB")

However, resists containing a resin having an alicyclic hydrocarbon structure for an ArF excimer laser have a problem that the rate of change of the pattern line width to the temperature at the time of PEB is large in forming minute patterns having a line width of 100 nm or less (hereinafter referred to as "PEB temperature dependency"). This problem becomes conspicuous with the fining of processing line width, thus a resist composition excellent in PEB temperature dependency and capable of forming a minute pattern is required.

In the present situation that necessitates forming a minute pattern of line width of 100 nm or less, in addition to the PEB temperature dependency, the needs of the improvements of resolution and the margin of exposure amount (the rate of change of the line width to the exposure amount) are pressing, and so the development of a resist composition satisfying resolution, the margin of exposure amount and PEB temperature dependency at the same time is demanded.

Basic compounds, specifically amine compounds, are generally used in chemical amplification resist compositions for the purpose of controlling the diffusion of acids generated upon exposure. As an example of using an amine compound having an ether bond in the molecule, JP-A-10-326015 (the term "JP-A" as used herein refers to an "unexamined published Japanese patent application") [for the purpose of the improvements of sensitivity, resolution, and environment-protecting characteristics] and JP-A-11-84639 [for the purpose of the improvements of pattern profile and the decrease of layer thickness) are heretofore known. However, at the existing circumstances, resolution, pattern profile, the margin of exposure amount and PEB temperature dependency are not simultaneously satisfied yet even in any combination as disclosed in the above patents, accordingly it is strongly desired to satisfy these characteristics at the same time.

SUMMARY OF THE INVENTION

Accordingly, an object of the present invention is to provide a positive resist composition excellent in resolution, and also excellent in the margin of exposure amount and PEB temperature dependency even in forming minute patterns of 100 nm or less.

The above object of the present invention can be achieved by the following constitution.

(1) A positive resist composition comprising:

(A) a resin increasing a solubility thereof in an alkali developer by an action of an acid;

(B) a compound capable of generating a sulfonic acid represented by the following formula (I) upon irradiation with an actinic ray or radiation; and (C1) at least one of an amine compound having at least an aliphatic hydroxyl group in a molecule and an amine compound having at least an ether bond in a molecule:

$$A_1\text{-}(A_2\text{-}SO_3H)_n \qquad (I)$$

wherein $A_1$ represents an n-valent linking group, $A_2$ represents a single bond or a divalent aliphatic group, and $A_2$'s each may be the same or different, provided that at least one group represented by $A_1$ or $A_2$ contains a fluorine atom, and n represents an integer of from 2 to 4.

(2) The positive resist composition as described in (1), wherein $A_2$ is an aliphatic group having a structure represented by the following formula (II):

$$(II)$$

wherein $Rf_1$ and $Rf_2$ each independently represents a hydrogen atom, a halogen atom, an alkyl group or a cycloalkyl group, provided that at least one of $Rf_1$ and $Rf_2$ represents a fluorine atom or a fluoroalkyl group.

(3) The positive resist composition as described in (1) or (2), wherein the component (B) is a compound selected from a sulfonium salt compound, an iodonium salt compound and an ester compound of the sulfonic acid represented by the formula (I).

As further preferred embodiments, the following constitutions are exemplified.

(4) The positive resist composition as described in (1), (2) or (3), wherein the amine compound of the component (C1) is at least a compound selected from the structures represented by the following formulae (C-1), (C-2) and (C-3):

(C-1)

(C-2)

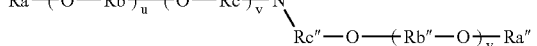

(C-3)

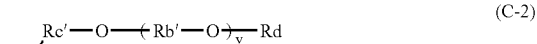

wherein Ra, Ra' and Ra" each independently represents a hydrogen atom, an alkyl group, a cycloalkyl group or an aryl group; Rb, Rb', Rb", Rc, Rc' and Rc" each may be the same or different in a case where a plurality of Rb, Rb', Rb", Rc, Rc' and Rc" are present, and each independently represents an alkylene group; Rd and Rd" independently each independently represents a hydrogen atom, an alkyl group, a cycloalkyl group or an aryl group; and u, v, w, x and y each independently represents an integer of from 0 to 15.

(5) The positive resist composition as described in any one of (1) to (4) further contains a surfactant.

(6) A pattern-forming method comprising forming a film from the positive resist composition as described in any one of (1) to (5), exposing the layer, and developing the exposed layer.

A positive resist composition excellent in resolution, and also excellent in the margin of exposure amount and PEB temperature dependency can be provided according to the present invention.

DETAILED DESCRIPTION OF THE INVENTION

The present invention will be described in detail below.

With respect to the description of a group (an atomic group) in the specification of the present invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] Resins Having a Monocyclic or Polycyclic Alicyclic Hydrocarbon Structure and Capable of Increasing the Solubility in an Alkali Developer by the Action of an Acid (Component (A)):

Resins capable of decomposing by the action of an acid to increase the solubility in an alkali developer by the action of an acid for use in a positive resist composition according to the present invention are resins having a group capable of decomposing by the action of an acid (hereinafter also referred to as "an acid-decomposable group") on the main chain or side chain, or both main chain and side chain of the resins.

Preferred groups capable of decomposing by the action of an acid are groups obtained by substituting the hydrogen atom of a —COOH group with a group capable of being desorbed by the action of an acid Preferred acid-decomposable groups are a cumyl ester group, an enol ester group, an acetal ester group and a tertiary alkyl ester group, and a tertiary alkyl ester group is more preferred.

As resins having a monocyclic or polycyclic alicyclic hydrocarbon structure and capable of decomposing by the action of an acid to increase the solubility in an alkali developer (hereinafter also referred to as alicyclic hydrocarbon acid-decomposable resins), resins having at least one repeating unit selected from the group consisting of a repeating unit having a partial structure containing alicyclic hydrocarbon represented by any of the following formulae (pI) to (pVI), and a repeating unit represented by the following formula (II-AB) are preferably used.

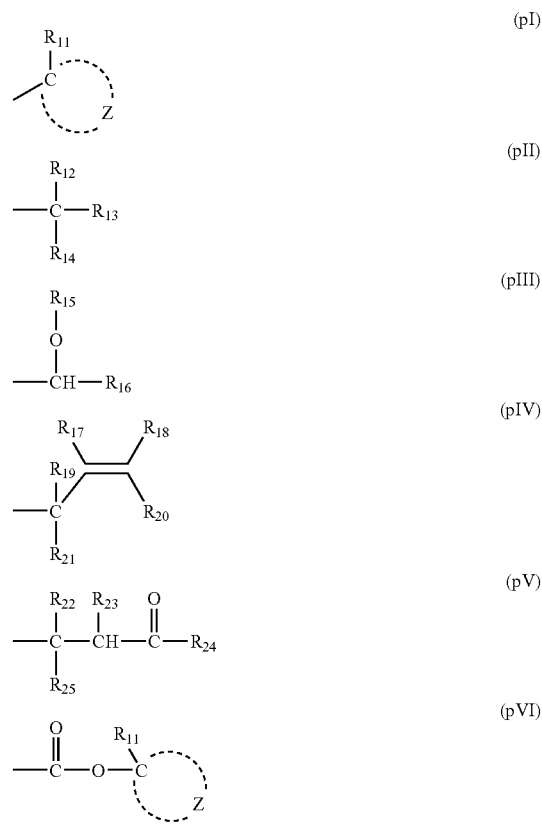

In the above formulae, $R_{11}$ represents a methyl group, an ethyl group, an n-propyl group, an isopropyl group, an n-butyl group, an isobutyl group or a sec-butyl group, and Z represents an atomic group necessary to form an alicyclic hydrocarbon group together with a carbon atom.

$R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$, $R_{13}$ and $R_{14}$, or either $R_{15}$ or $R_{16}$, represents an alicyclic hydrocarbon group.

$R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group. Either $R_{19}$ or $R_{21}$ represents a straight chain or branched alkyl group having from 1 to 4 carbon atoms, or an alicyclic hydrocarbon group.

$R_{22}$, $R_{23}$, $R_{24}$ and $R_{25}$ each independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group. $R_{23}$ and $R_{24}$ may be bonded to each other to form a ring.

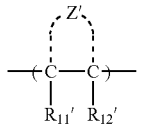

(II-AB)

In formula (II-AB), $R_{11}'$ and $R_{12}'$ each independently represents a hydrogen atom, a cyano group, a halogen atom or an alkyl group.

Z' contains bonded two carbon atoms (C—C) and represents an atomic group necessary to form an alicyclic structure.

Formula (II-AB) is preferably represented by the following formula (II-A) or (II-B).

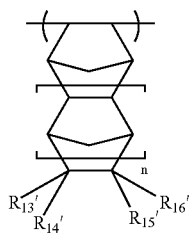

(II-A)

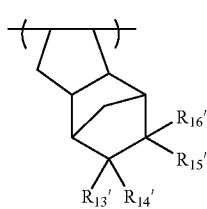

(II-B)

In formulae (II-A) and (II-B), $R_{13}'$, $R_{14}'$ $R_{15}'$ and $R_{16}'$ each independently represents a hydrogen atom, a halogen atom, a cyano group, —COOH, —COOR$_5$, an acid-decomposable group, —C(=O)—X-A' —R$_{17}'$, an alkyl group or an alicyclic hydrocarbon group.

$R_5$ represents an alkyl group, a cyclic hydrocarbon group, or the following shown —Y group.

X represents an oxygen atom, a sulfur atom, —NH—, —NHSO$_2$— or —NNHSO$_2$NH—.

A' represents a single bond or a divalent linking group.

At least two of $R_{13}'$ to $R_{16}'$ may be bonded to each other to form a ring. n represents 0 or 1.

$R_{17}'$ represents —COOH, —COOR$_5$, —CN, a hydroxyl group, an alkoxyl group, —CONH—R$_6$, —CO—NH—SO$_2$—R$_6$ or the following shown —Y group.

$R_6$ represents an alkyl group or a cyclic hydrocarbon group.

—Y group:

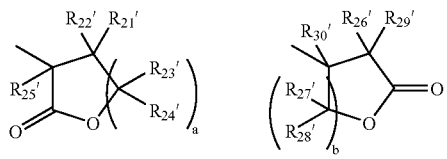

In a —Y group, $R_{21}'$ to $R_{30}'$ each independently represents a hydrogen atom or an alkyl group, and a and b each represents 1 or 2.

In formulae (pI) to (pVI), the alkyl group represented by $R_{12}$ to $R_{25}$ is a straight chain or branched alkyl group having from 1 to 4 carbon atoms, e.g., a methyl group, an ethyl group, an n-propyl group, an isopropyl group, an n-butyl group, an isobutyl group, a sec-butyl group or a t-butyl group.

As the substituents that the above alkyl and alkoxyl groups may have, an alkoxyl group having from 1 to 4 carbon atoms, a halogen atom (e.g., fluorine, chlorine, bromine and iodine atoms), an acyl group, an acyloxy group, a cyano group, a hydroxyl group, a carboxyl group, an alkoxycarbonyl group and a nitro group are exemplified.

The alicyclic hydrocarbon group represented by $R_{11}$ to $R_{25}$ or the alicyclic hydrocarbon group formed by Z and a carbon atom may be monocyclic or polycyclic. The specific examples thereof include groups having a monocyclo, bicyclo, tricyclo or tetracyclo structure having 5 or more carbon. The number of carbon atoms of these groups is preferably from 6 to 30, and particularly preferably from 7 to 25. These alicyclic hydrocarbon groups may have a substituent.

The preferred examples of alicyclic hydrocarbon groups include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. An adamantyl group, a decalin residue, a norbornyl group, a cedrol group, a cyclohexyl group, a cycloheptyl group, a cyclooctyl group, a cyclodecanyl group and a cyclododecanyl group are more preferred.

As the substituents of these alicyclic hydrocarbon groups, an alkyl group, a halogen atom, a hydroxyl group, an alkoxyl group, a carboxyl group and an alkoxycarbonyl group are exemplified. As the alkyl group, a lower alkyl group, e.g., methyl, ethyl, propyl, isopropyl and butyl groups are preferred, and more preferred substituents are selected from the group consisting of methyl, ethyl, propyl and isopropyl groups. As the alkoxyl group, alkoxyl groups having from 1 to 4 carbon atoms, e.g., methoxy, ethoxy, propoxy and butoxy groups are exemplified. The alkyl, alkoxyl and alkoxycarbonyl groups each may further have a substituent, and the examples of the substituents include a hydroxyl group, a halogen atom and an alkoxyl group.

The structures represented by formulae (pI) to (pVI) in the resins of component (A) can be used for the protection of alkali-soluble groups. Various groups well known in this technical field can be used as the alkali-soluble groups.

The specific examples of the alkali-soluble groups include a carboxylic acid group, a sulfonic acid group, a phenol group and a thiol group, preferably a carboxylic acid group and a sulfonic acid group.

As the alkali-soluble groups protected with any of the structures represented by formulae (pI) to (pVI) in the resins of component (A), such structures that the hydrogen atom of a carboxyl group is substituted with the structure represented by any of formulae (pI) to (pVI) are preferred.

As the repeating unit having an alkali-soluble group protected with the structure represented by any of formula (pI) to (pVI), a repeating unit represented by the following formula (pA) is preferred.

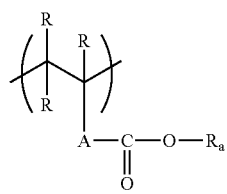

(pA)

In formula (pA), R represents a hydrogen atom, a halogen atom, or a straight chain or branched alkyl group having from 1 to 4 carbon atoms. A plurality of R's may be the same or different.

A represents a single bond, or a single group or a combination of two or more groups selected from the group consisting of an alkylene group, an ether group, a thioether group, a carbonyl group, an ester group, an amido group, a sulfonamido group, a urethane group and a urea group.

Ra represents a group represented by any of formulae (pI) to (pVI).

The repeating unit represented by formula (pA) is most preferably a repeating unit by 2-alkyl-2-adamantyl (meth)-acrylate or dialkyl(1-adamantyl)methyl (meth)acrylate.

The specific examples of the repeating units represented by formula (pA) are shown below.

In the formulae, $R_x$ represents H, $CH_3$ or $CF_3$.

1

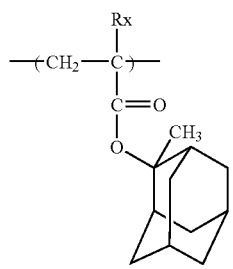

2

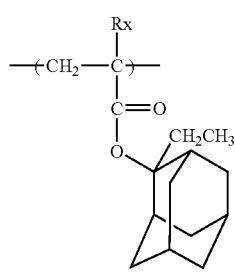

-continued

3

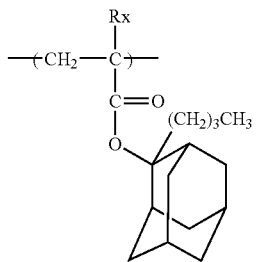

4

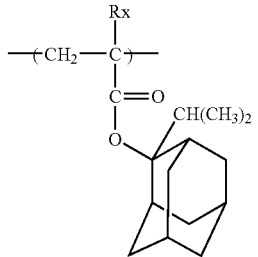

5

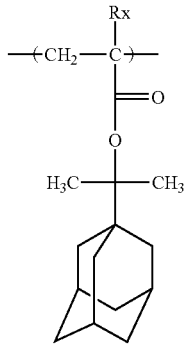

6

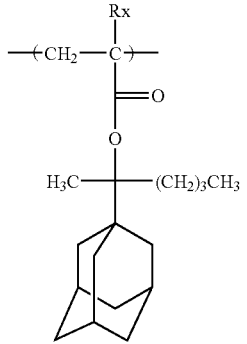

7

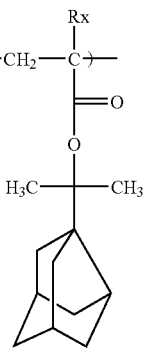

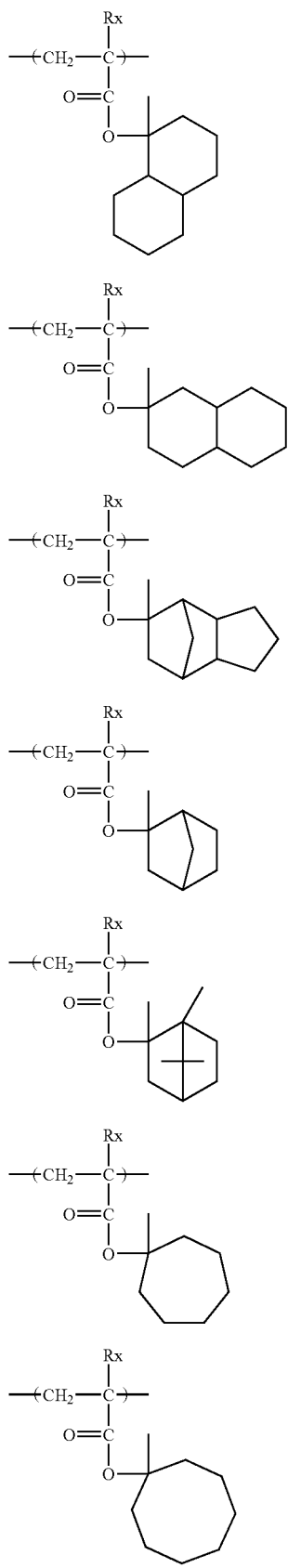
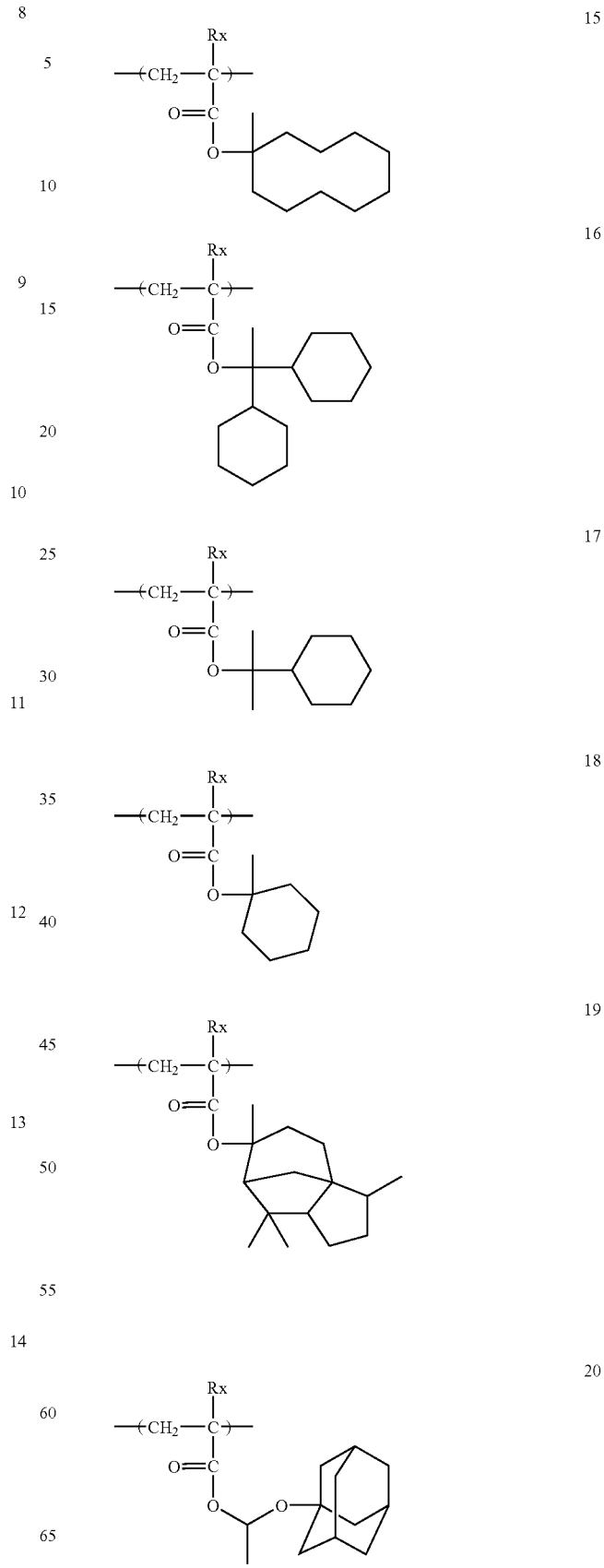

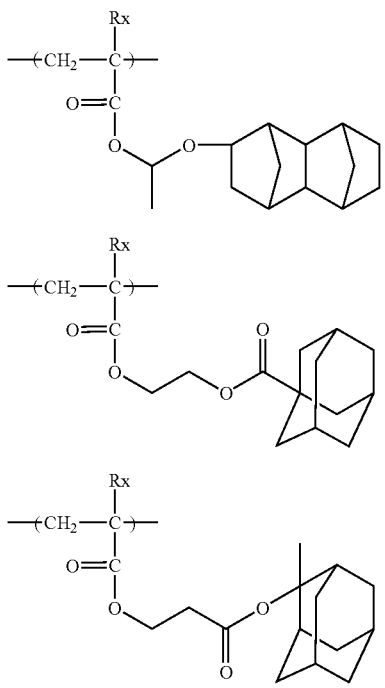

In formula (II-AB), $R_{11}'$ and $R_{12}'$ each independently represents a hydrogen atom, a cyano group, a halogen atom or an alkyl group.

Z' contains bonded two carbon atoms (C—C) and represents an atomic group necessary to form an alicyclic structure.

As the halogen atoms represented by $R_{11}'$ and $R_{12}'$, a chlorine atom, a bromine atom, a fluorine atom and an iodine atom are exemplified.

The alkyl group represented by $R_{11}'$, $R_{12}'$, $R_{21}'$ to $R_{30}'$ is preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group or a t-butyl group.

As further substituents of the alkyl group, a hydroxyl group, a halogen atom, a carboxyl group, an alkoxyl group, an acyl group, a cyano group and an acyloxy group can be mentioned. As the halogen atom, a chlorine atom, a bromine atom, a fluorine atom and an iodine atom can be exemplified. As the alkoxyl group, an alkoxyl group having from 1 to 4 carbon atoms, e.g., a methoxy group, an ethoxy group, a propoxy group and a butoxy group can be exemplified. As the acyl group, a formyl group and an acetyl group can be exemplified, and as the acyloxy group, an acetoxy group can be exemplified.

The atomic group for forming an alicyclic structure represented by Z' is an atomic group necessary for forming a repeating unit of alicyclic hydrocarbon that may have a substituent into a resin, and the atomic group is particularly preferably an atomic group for forming a crosslinking alicyclic structure to form a repeating unit of crosslinking alicyclic hydrocarbon.

As the skeleton of the alicyclic hydrocarbon to be formed, the same alicyclic hydrocarbon groups represented by $R_{11}$ to $R_{25}$ in formulae (pI) to (pVI) are exemplified.

The skeleton of the alicyclic hydrocarbon may have a substituent. As the examples of the substituents, the substituents represented by $R_{13}'$ to $R_{16}'$ in formulae (II-A) and (II-B) are exemplified.

Of the repeating units having the crosslinking alicyclic hydrocarbon, a repeating unit represented by formula (II-A) or (II-B) is more preferred.

In the alicyclic hydrocarbon acid-decomposable resin according to the invention, an acid-decomposable group may be contained in —C (=O)—X-A'-$R_{17}'$ or may be contained as the substituent of Z' in formula (II-AB).

The structure of an acid-decomposable group is represented by formula —C(=O)—$X_1$—$R_0$.

In the above formula, $R_0$ represents a tertiary alkyl group, e.g., a t-butyl group, a t-amyl group; a 1-alkoxyethyl group, e.g., an isoboronyl group, a 1-ethoxyethyl group, a 1-butoxy-ethyl group, a 1-isobutoxyethyl group, a 1-cyclohexyloxyethyl group; an alkoxymethyl group, e.g., a 1-methoxymethyl group, a 1-ethoxymethyl group; a 3-oxoalkyl group, a tetrahydro-pyranyl group, a tetrahydrofuranyl group, a trialkylsilyl ester group, a 3-oxocyclohexyl ester group, a 2-methyl-2-adamantyl group or a mevalonic lactone residue. $X_1$ has the same meaning as X described above.

As the halogen atom represented by $R_{13}'$ to $R_{16}'$, a chlorine atom, a bromine atom, a fluorine atom and an iodine atom are exemplified.

The alkyl group represented by $R_5$, $R_6$, $R_{13}'$ to $R_{16}'$ is preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group or a t-butyl group.

The cyclic hydrocarbon group represented by $R_5$, $R_6$, $R_{13}'$ to $R_{16}'$ is, e.g., a cyclic alkyl group or crosslinking hydrocarbon, and as the cyclic hydrocarbon group a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornaneepoxy group, a menthyl group, an isomenthyl group, a neomenthyl group, and a tetracyclododecanyl group are exemplified.

As the rings formed by the bonding of at least two of $R_{13}'$ to $R_{16}'$, rings having from 5 to 12 carbon atoms, e.g., cyclopentene, cyclohexene, cycloheptane and cyclooctane are exemplified.

As the alkoxyl group represented by $R_{17}'$, an alkoxyl group having from 1 to 4 carbon atoms, e.g., a methoxy group, an ethoxy group, a propoxy group and a butoxy group are exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group and a cyclic hydrocarbon group can be exemplified. As the halogen atom, a chlorine atom, a bromine atom, a fluorine atom and an iodine atom can be exemplified. As the alkoxyl group, an alkoxyl group having from 1 to 4 carbon atoms, e.g., a methoxy group, an ethoxy group, a propoxy group and a butoxy group can be exemplified. As the acyl group, a formyl group and an acetyl group can be exemplified, and as the acyloxy group, an acetoxy group can be exemplified.

As the alkyl and cyclic hydrocarbon groups, those described above can be exemplified.

As the divalent linking group represented by A', a single group or a combination of two or more groups selected from the group consisting of an alkylene group, an ether group, a thioether group, a carbonyl group, an ester group, an amido group, a sulfonamido group, a urethane group and a urea group can be exemplified.

In the alicyclic hydrocarbon acid-decomposable resin according to the invention, a group decomposing by the action of an acid can be contained in at least one repeating unit of a repeating unit having a partial structure containing alicyclic hydrocarbon represented by any of formulae (pI) to (pVI), a repeating unit represented by formula (II-AB), and a repeating unit of a copolymer component described later.

Various kinds of substituents represented by $R_{13}'$ to $R_{16}'$ in formula (II-A) or (II-B) are also the substituents of the atomic group for forming an alicyclic structure in formula (II-AB) or atomic group Z for forming a crosslinking alicyclic structure.

The specific examples of the repeating units represented by formula (II-A) or (II-B) are shown below, but the present invention is not limited to these examples.

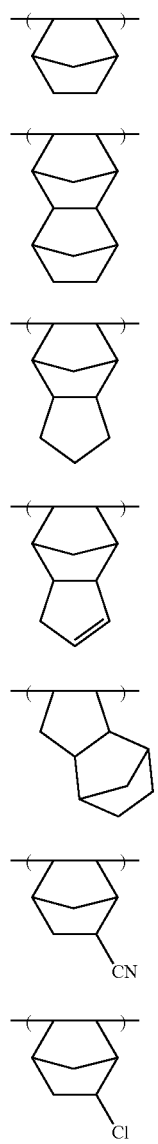

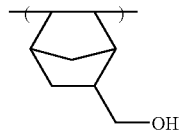

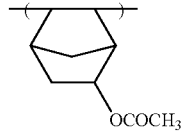

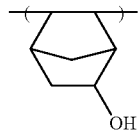

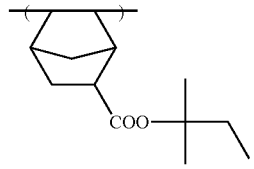

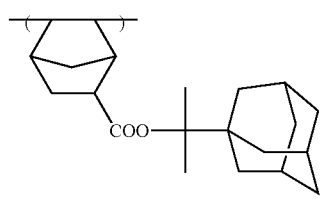

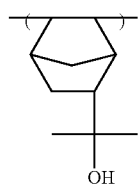

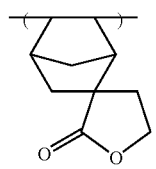

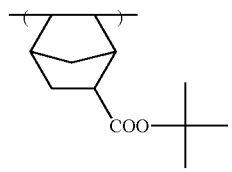

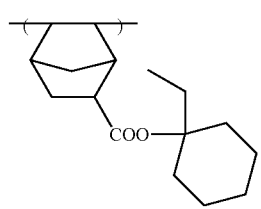

-continued
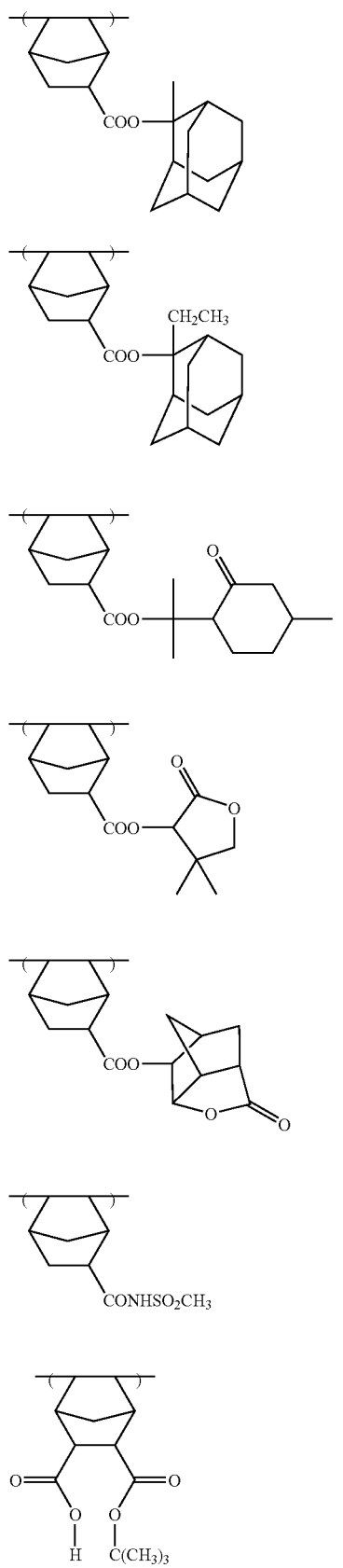
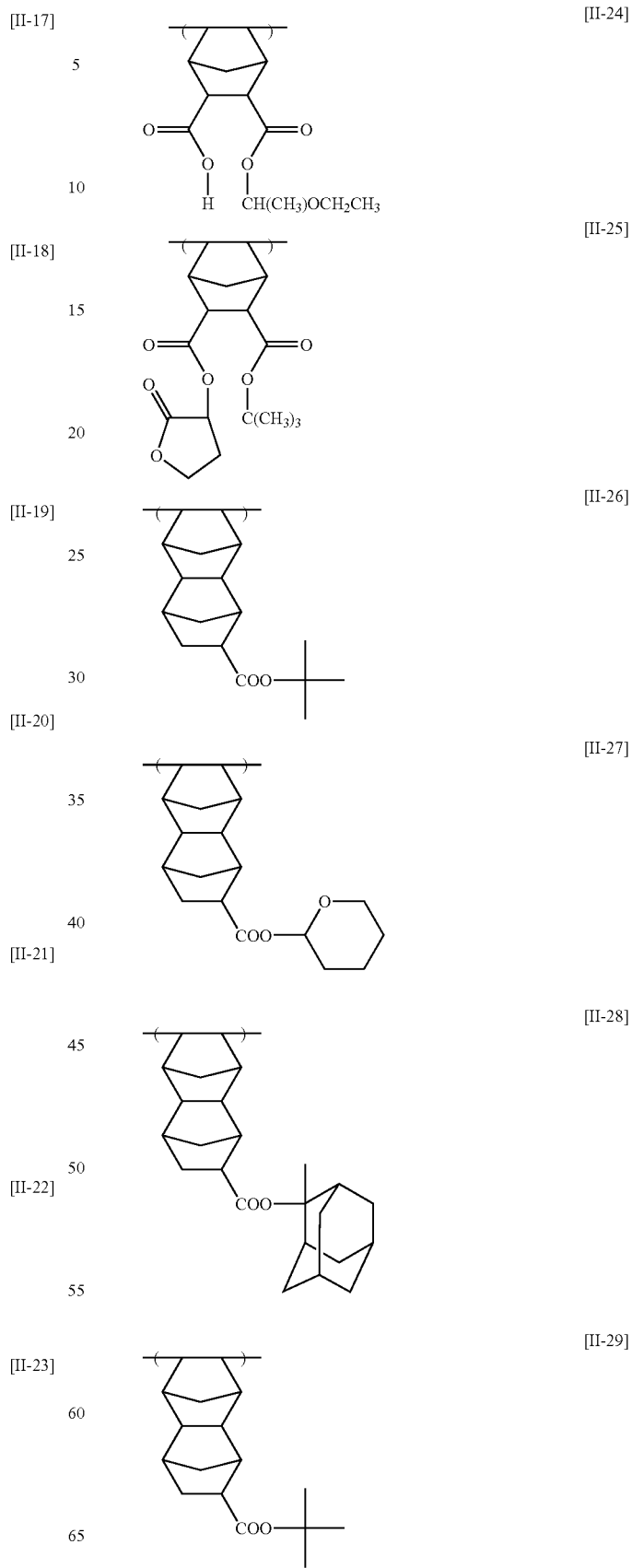

-continued

[II-30]

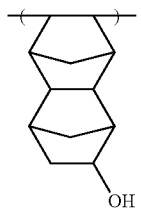

[II-31]

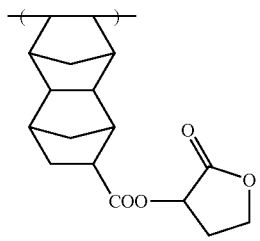

[II-32]

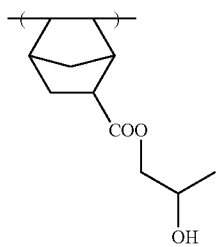

It is preferred for the alicyclic hydrocarbon acid-decomposable resin in the invention to have a lactone group, and it is more preferred to have a repeating unit having a group having a lactone structure represented by the following formula (Lc) or any of the following formulae (V-1) to (V-5), and a group having a lactone structure may be directly bonded to the main chain.

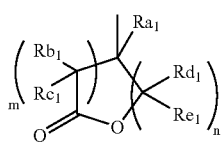  (Lc)

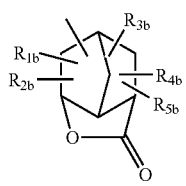  (V-1)

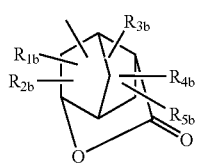  (V-2)

-continued

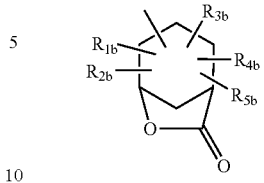  (V-3)

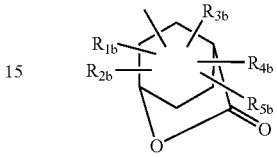  (V-4)

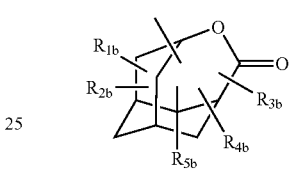  (V-5)

In formula (Lc), $R_{a1}$, $R_{b1}$, $R_{c1}$, $R_{d1}$ and $R_{e1}$ each independently represents a hydrogen atom or an alkyl group, m and n each independently represents an integer of from 0 to 3, and m+n is from 2 to 6.

In formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group, an alkenyl group, or —$COOR_a$. $R_a$ represents an alkyl group. Two of $R_{1b}$ to $R_{5b}$ may be bonded to each other to form a ring.

The alkyl group represented by $R_{a1}$ to $R_{e1}$ in formula (Lc), the alkyl group, and the alkyl group in the alkoxyl group, alkoxycarbonyl group and alkylsulfonylimino group represented by $R_{1b}$ to $R_{5b}$ and $R^a$ in formulae (V-1) to (V-5) are straight chain or branched alkyl groups, which may have a substituent. As the substituents that each of these groups may have, e.g., an alkoxyl group having from 1 to 4 carbon atoms, a halogen atom (e.g., a fluorine atom, a chlorine atom, a bromine atom, an iodine atom), an acyl group having from 2 to 5 carbon atoms, an acyloxy group having from 2 to 5 carbon atoms, a cyano group, a hydroxyl group, a carboxyl group, an alkoxycarbonyl group having from 2 to 5 carbon atoms, and a nitro group are exemplified.

As the repeating unit having a group having a lactone structure represented by formula (Lc) or any of formulae (V-1) to (V-5), a repeating unit represented by formula (II-A) or (II-B) in which at least one of $R_{13}'$ to $R_{16}'$ has a group represented by formula (Lc) or any of formulae (V-1) to (V-5) (e.g., $R_5$ of —$COOR_5$ is a group represented by formula (Lc) or any of formulae (V-1) to (V-5)), or a repeating unit represented by the following formula (AI) can be exemplified.

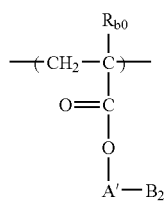
(AI)

In formula (AI), $R_{b0}$ represents a hydrogen atom, a halogen atom, or an alkyl group having from 1 to 4 carbon atoms. As the preferred substituents that the alkyl group represented by $R_{b0}$ may have, the above-shown preferred substituents that the alkyl group represented by $R_{1b}$ in formulae (V-1) to (V-5) may have are exemplified.

As the halogen atom represented by $R_{b0}$, a fluorine atom, a chlorine atom, a bromine atom and an iodine atom are exemplified. $R_{b0}$ preferably represents a hydrogen atom.

A' represents a single bond, an ether group, an ester group, a carbonyl group, an alkylene group or a divalent linking group combining these groups.

$B_2$ represents a group represented by formula (Lc) or any of formulae (V-1) to (V-5).

The specific examples of repeating units having a group having a lactone structure are shown below, however, the present invention is not limited to these compounds.

In the formulae, $R_x$ represents H, $CH_3$ or $CF_3$.

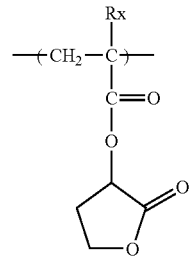
(IV-1)

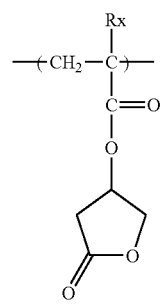
(IV-2)

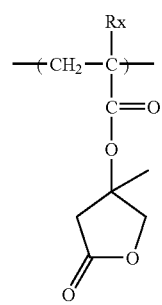
(IV-3)

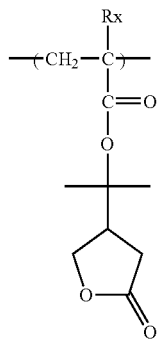
(IV-4)

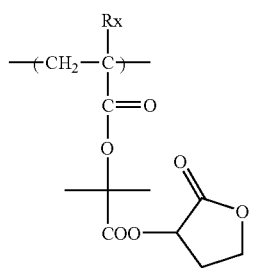
(IV-5)

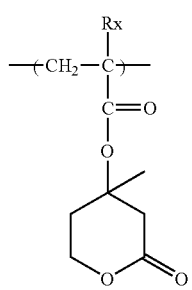
(IV-6)

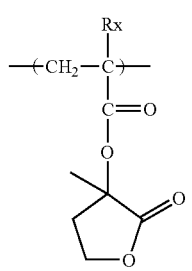
(IV-7)

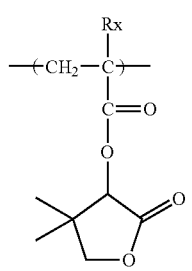
(IV-8)

-continued
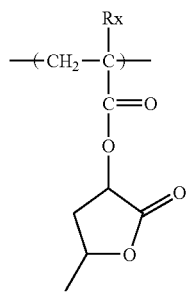
(IV-9)
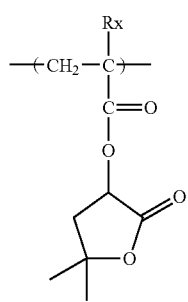
(IV-10)
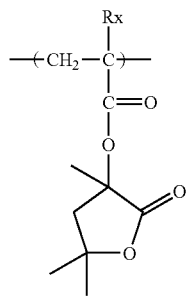
(IV-11)
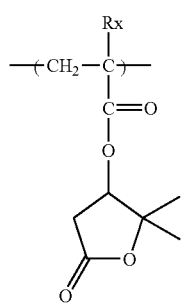
(IV-12)
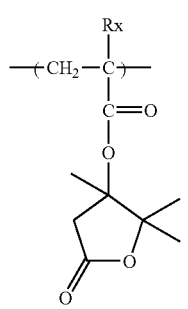
(IV-13)
-continued
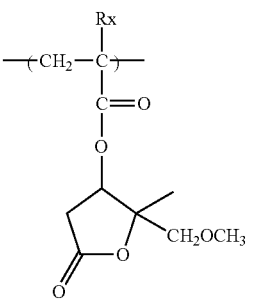
(IV-14)
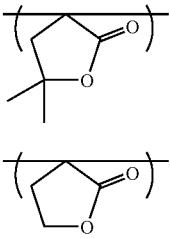
(IV-15)
(IV-16)
In the formulae, $R_x$ represents H, $CH_3$ or $CF_3$.
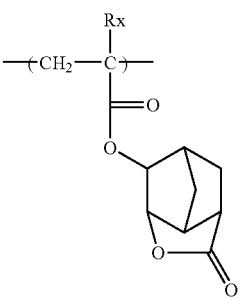
(Ib-1)
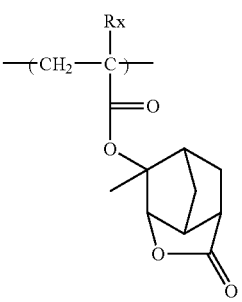
(Ib-2)
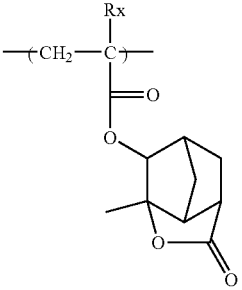
(Ib-3)

(Ib-4)
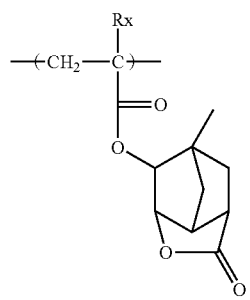
(Ib-5)
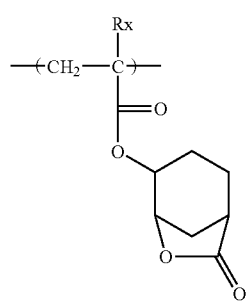
(Ib-6)
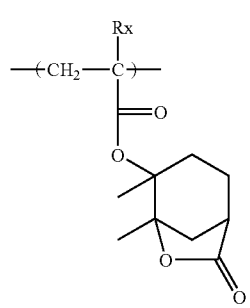
(Ib-7)
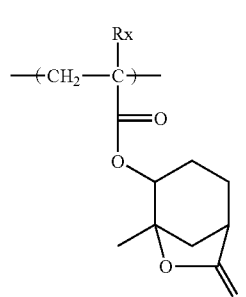
(Ib-8)
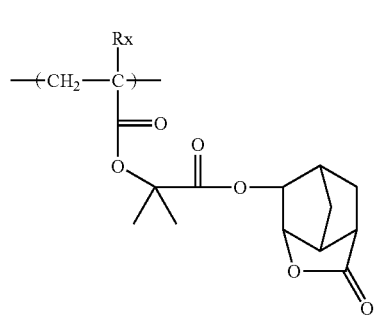
(Ib-9)
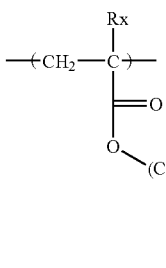
(Ib-10)
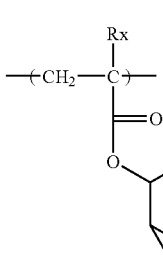
(Ib-11)
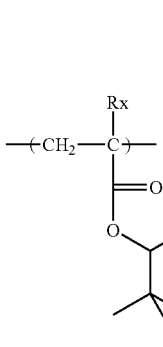
In the formulae, $R_x$ represents H, $CH_3$ or $CF_3$.
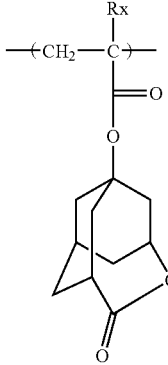

-continued

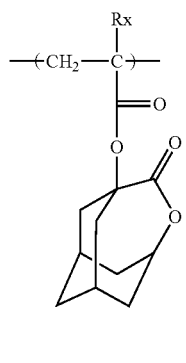
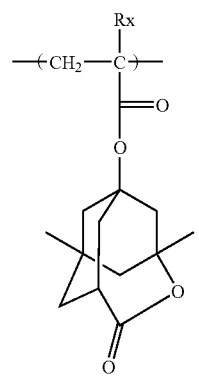

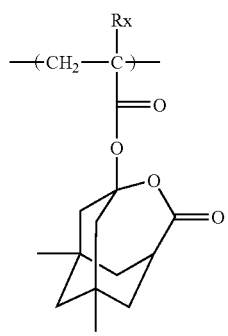
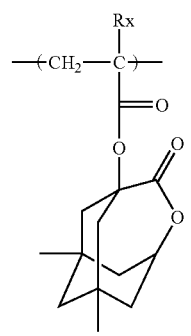

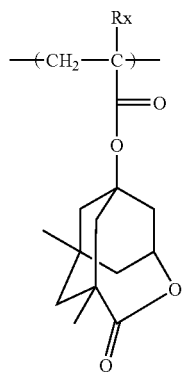
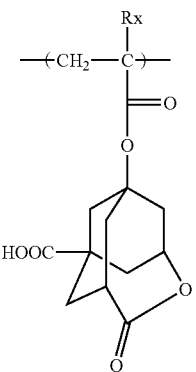

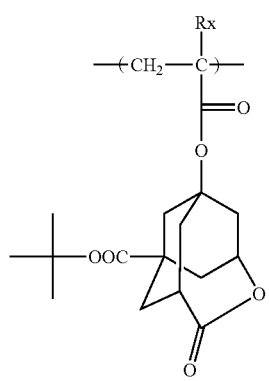
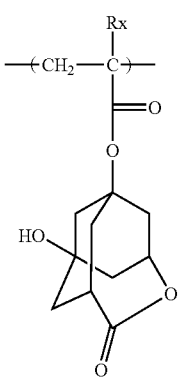

-continued

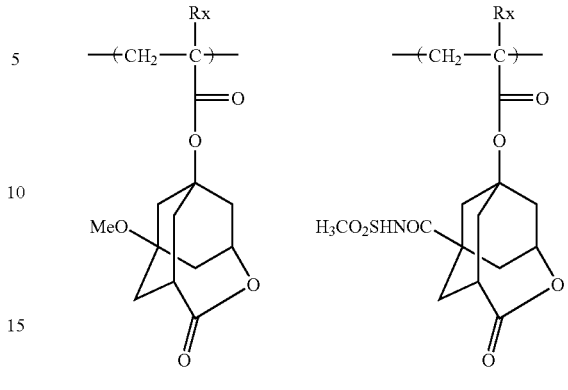

The alicyclic hydrocarbon acid-decomposable resin in the invention may contain a repeating unit having a group represented by the following formula (VII).

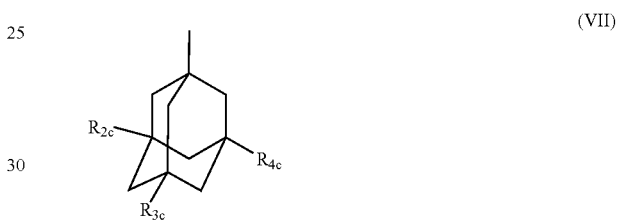

(VII)

In formula (VII), $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

The group represented by formula (VII) is preferably a dihydroxy compound or a monohydroxy compound, and more preferably a dihydroxy compound.

As the repeating unit having a group represented by formula (VII), a repeating unit represented by formula (II-A) or (II-B) in which at least one of $R_{13}'$ to $R_{16}'$ has a group represented by formula (VII) (e.g., $R_5$ of —$COOR_5$ is a group represented by formula (VII)), or a repeating unit represented by the following formula (AII) can be exemplified.

(AII)

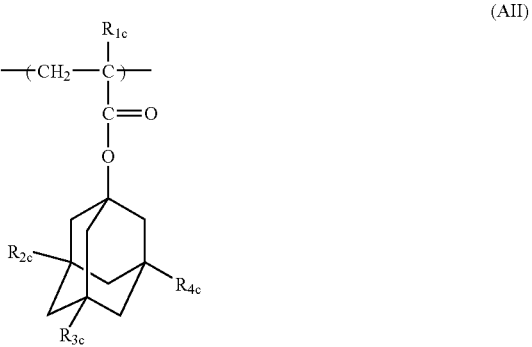

In formula (AII), $R_{1c}$ represents a hydrogen atom or a methyl group.

$R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group, and preferably two of $R_{2c}$, $R_{3c}$ and $R_{4c}$ represent a hydroxyl group.

The specific examples of the repeating units having a structure represented by formula (AII) are shown below, but the present invention is not limited to these examples.

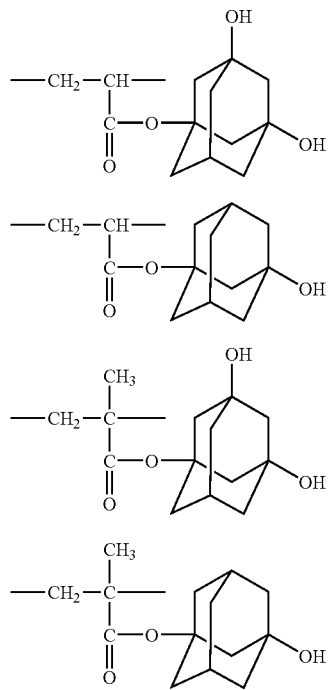

The alicyclic hydrocarbon acid-decomposable resin in the invention may contain a repeating unit represented by the following formula (VIII).

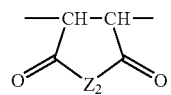

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group represented by $R_{41}$ and $R_{42}$ may be substituted with a halogen atom (preferably a fluorine atom).

The specific examples of the repeating units represented by formula (VIII) are shown below, but the present invention is not limited to these examples.

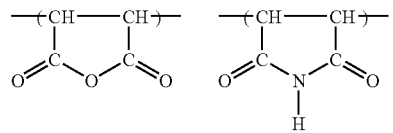

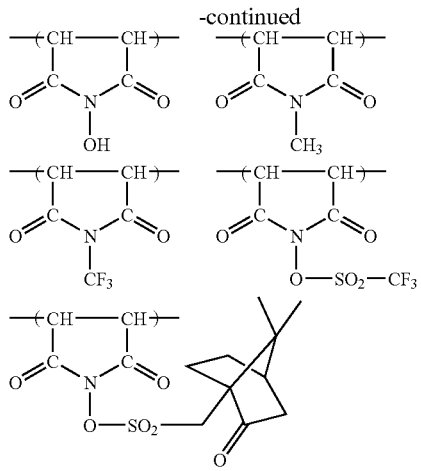

The alicyclic hydrocarbon acid-decomposable resin in the invention may contain various repeating structural units besides the above repeating units for the purpose of adjusting dry etching resistance, standard developer aptitude, adhesion to a substrate, resist profile, and in addition to these, general requisite characteristics of resists, e.g., resolution, heat resistance and sensitivity.

As such repeating structural units, the repeating structural units corresponding to the following shown monomers can be exemplified, however the present invention is not limited thereto.

By containing various kinds of repeating structural units, fine adjustment of performances required of alicyclic hydrocarbon acid-decomposable resins, in particular fine adjustment of the following performances becomes possible, that is, (1) Solubility in a coating solvent,
(2) Layer-forming property (a glass transition point),
(3) Alkali developability,
(4) Decrease of layer thickness (hydrophobic-philic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In alicyclic hydrocarbon acid-decomposable resins, the molar ratio of the content of each repeating structural unit is arbitrarily selected to adjust the dry etching resistance, standard developer aptitude, adhesion to a substrate of resists, and resist profile, in addition to these, to adjust general requisite characteristics of resists, e.g., resolution, heat resistance and sensitivity.

The preferred modes of alicyclic hydrocarbon acid-decomposable resins in the invention include the following.

(1) Resins containing a repeating unit having a partial structure containing alicyclic hydrocarbon represented by any of formulae (pI) to (pVI) (a side chain type).

(2) Resins containing a repeating unit represented by formula (II-AB) (a main chain type), and the following mode is further exemplified in (2).
(3) Resins containing a repeating unit represented by formula (II-AB), a maleic anhydride derivative and a (meth) acrylate structure (a hybrid type).

In alicyclic hydrocarbon acid-decomposable resins, the content of a repeating unit having an acid decomposable group is preferably from 10 to 70 mol % in all the repeating structural units, more preferably from 20 to 65 mol %, and still more preferably from 25 to 60 mol %.

In alicyclic hydrocarbon acid-decomposable resins, the content of a repeating unit having a partial structure containing alicyclic hydrocarbon represented by any of formulae (pI) to (pVI) is preferably from 20 to 70 mol % in all the repeating structural units, more preferably from 24 to 65 mol %, and still more preferably from 28 to 60 mol %.

In alicyclic hydrocarbon acid-decomposable resins, the content of a repeating unit represented by formula (II-AB) is preferably from 10 to 60 mol % in all the repeating structural units, more preferably from 15 to 55 mol %, and still more preferably from 20 to 50 mol %.

The content of a repeating structural unit on the basis of the monomer of a further copolymer component in the resins can also be arbitrarily set according to the desired resist performances, and the content of the repeating unit is generally preferably 99 mol % or less based on the total mol number of a repeating unit having a partial structure containing alicyclic hydrocarbon represented by any of formulae (pI) to (pVI) and a repeating unit represented by formula (II-AB), more preferably 90 mol % or less, and still more preferably 80 mol % or less.

When the composition according to the invention is a composition for ArF exposure, it is preferred that the resin should not contain an aromatic group from the point of the transparency to ArF light.

Alicyclic hydrocarbon acid-decomposable resins for use in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent such as cyclic ethers, e.g., tetrahydrofuran or 1,4-dioxane, ketones, e.g., methyl ethyl ketone, methyl isobutyl ketone or cyclohexanone, or the later-described solvents capable of dissolving the composition of the invention, e.g., propyelne glycol monomethyl ether acetate or propylene glycol monomethyl ether to make the monomer homogeneous. The solution is then heated, if necessary, under the inert gas atmosphere such as nitrogen or argon, and polymerization is initiated with commercially available radical polymerization initiator (e.g., azo initiators, peroxide and the like). If necessary, the initiator is further added at a time or in parts, and after completion of the reaction, the reaction system is put into a solvent, and the desired polymer is recovered as powder or solid. The reaction concentration is 10 weight % or more, preferably 15 weight % or more, and more preferably 20 weight % or more. The reaction temperature is from 10 to 150° C., preferably from 30 to 130° C., and more preferably from 50 to 110° C.

Each repeating structural unit shown by specific examples above may be used alone or a plurality of repeating structural units may be used in combination.

Further, in the present invention, resins may be used alone or a plurality of resins may be used in combination.

Resins for use in the invention have a weight average molecular weight of preferably from 1,000 to 200,000, more preferably from 3,000 to 20,000, in terms of polystyrene by GPC method. The weight average molecular weight in the above range is preferred for achieving various performances, e.g., heat resistance, dry etching resistance, developability, layer-forming property, and in the point of balances among various performances.

The molecular weight distribution of resins is generally from 1 to 5, preferably from 1 to 4, and more preferably from 1 to 3. It is preferred to make the molecular weight distribution 5 or less in view of resolution, resist form and prevention of the dry area of resist pattern wall and roughness.

In the positive resist composition according to the present invention, the blending amount of all the resins in the entire composition is preferably from 40 to 99.99 weight % in all the resist solids content, and more preferably from 50 to 99.97 weight %.

[2] Compounds Capable of Generating an Acid upon Irradiation with an Actinic Ray or Radiation (Component (B)):

The positive resist composition in the present invention contains compound (B1) capable of generating a sulfonic acid represented by the following formula (I) upon irradiation with an actinic ray or radiation.

$$A_1\text{-}(A_2\text{-}SO_3H)_n \qquad (I)$$

In formula (I), $A_1$ represents an n-valent linking group, $A_2$ represents a single bond or a divalent aliphatic group, and $A_2$'s each may be the same or different, provided that at least one group represented by $A_1$ or $A_2$ contains a fluorine atom, and n represents an integer of from 2 to 4.

As the linking group represented by $A_1$, an alkylene group, a cycloalkylene group, an arylene group, an alkenylene group, a single bond, an ether bond, an ester bond, an amido bond, a sulfide bond, a urea bond, and linking groups obtained by linking a plurality of these groups are exemplified as divalent linking groups. When n represents 3 or 4, $A_1$ represents a group that further one or two groups represented by -$A_2$-$SO_3H$ are substituted on the optional positions of any of these divalent linking groups.

As the alkylene group represented by $A_1$, which may have a substituent, preferably an alkylene group having from 1 to 8 carbon atoms, e.g., a methylene group, an ethylene group, a propylene group, a butylene group, a hexylene group and an octylene group are exemplified.

As the cycloalkylene represented by $A_1$, which may have a substituent, preferably a cycloalkylene group having from 3 to 8 carbon atoms, e.g., a cyclopentylene group and a cyclohexylene group are exemplified.

As the alkenylene group represented by $A_1$, which may have a substituent, preferably an. alkenylene group having from 2 to 6 carbon atoms, e.g., an ethenylene group, a propenylene group, and a butenylene group are exemplified.

As the arylene group represented by $A_1$, which may have a substituent, preferably an arylene group having from 6 to 15 carbon atoms, e.g., a phenylene group, a tolylene group, and a naphthylene group are exemplified.

The substituents that these groups may have include groups having active hydrogen, e.g., a cycloalkyl group, an aryl group, an amino group, an amido group, a ureido group, a urethane group, a hydroxyl group and a carboxyl group, a halogen atom (e.g., a fluorine atom, a chlorine atom, a bromine atom and an iodine atom), an alkoxyl group (e.g., a methoxy group, an ethoxy group, a propoxy group and a. butoxy group), a thioether group, an acyl group (e.g., an acetyl group, a propanoyl group and a benzoyl group), an acyloxy group (e.g., an acetoxy group, a propanoyloxy group, a benzoyloxy group), an alkoxycarbonyl group (e.g., a methoxycarbonyl group, an ethoxycarbonyl group and a propoxycarbonyl group), a cyano group, and a nitro group. With respect to the arylene group, an alkyl group (e.g., a methyl group, an ethyl group, a propyl group and a butyl group) can be further exemplified.

The divalent aliphatic group represented by $A_2$ is preferably an alkylene group having from 1 to 8 carbon atoms or a cycloalkylene group, more preferably an alkylene group or a cycloalkylene group substituted with a fluorine atom or a fluoroalkyl group.

As the alkylene group represented by $A_2$, which may have a substituent, preferably an alkylene group having from 1 to 8 carbon atoms, e.g., a methylene group, an ethylene group, a propylene group, a butylene group, a hexylene group and an octylene group are exemplified.

As the cycloalkylene represented by $A_2$, which may have a substituent, preferably a cycloalkylene group having from 3 to 8 carbon atoms, e.g., a cyclopentylene group and a cyclohexylene group are exemplified.

As the fluoroalkyl group (an alkyl group in which at least one hydrogen atom is substituted with a fluorine atom) that the alkylene group and cycloalkylene group represented by $A_2$ preferably have, which may have a substituent, a fluoroalkyl group preferably having from 1 to 8 carbon atoms, more preferably from 1 to 3 carbon atoms, e.g., a monofluoromethyl group, a difluoromethyl group, a trifluoromethyl group, a 2,2,2-trifluoroethyl group, a pentafluoroethyl group, a 2,2,3,3,3-pentafluoropropyl group, a heptafluoropropyl group, a 2,2,3,3,4,4,4-heptafluorobutyl group, a nonafluorobutyl group, and a perfluorohexyl group are exemplified. As the further substituents of the fluoroalkyl group, e.g., a hydroxyl group, an alkoxyl group (preferably having from 1 to 5 carbon atoms), a halogen atom and a cyano group are exemplified.

Further, $A_2$ is preferably an aliphatic group having a structure represented by the following formula (II).

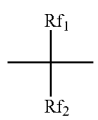
(II)

In formula (II), $Rf_1$ and $Rf_2$ each independently represents a hydrogen atom, a halogen atom, an alkyl group or a cycloalkyl group, provided that at least one of $Rf_1$ and $Rf_2$ represents a fluorine atom or a fluoroalkyl group.

As the alkyl group represented by $Rf_1$ and $Rf_2$, which may have a substituent, preferably an alkyl group having from 1 to 8 carbon atoms, e.g., a methyl group, an ethyl group, a propyl group, an n-butyl group and a sec-butyl group are exemplified. As the substituent that the alkyl group represented by $Rf_1$ and $Rf_2$ may have, a halogen atom is preferably exemplified.

As the cycloalkyl group represented by $Rf_1$ and $Rf_2$, which may have a substituent, preferably a cycloalkyl group having from 3 to 8 carbon atoms, e.g., a cyclopentyl group and a cyclohexyl group are preferably exemplified.

The fluoroalkyl group represented by $Rf_1$ and $Rf_2$ is a group that a fluorine atom is substituted on the above alkyl group or cycloalkyl group, e.g., the above groups mentioned as the fluoroalkyl group can be exemplified.

n represents an integer of from 2 to 4, preferably 2 or 3, and still more preferably 2.

It is preferred that the structure represented by formula (II) be bonded to the neighboring position of a sulfonic acid (e.g., the sulfur atom of a sulfonic acid atomic group).

The sulfonic acid represented by formula (I) is particularly preferably a sulfonic acid represented by the following formula (III).

In formula (III), $A_1$ and n respectively have the same meaning as $A_1$ and n in formula (I).

$A_2$ represents a single bond, an ether bond, a sulfide bond, an alkylene group, a cycloalkylene group or an arylene group, more preferably a single bond or an ether bond. $A_3$, a and b of n may be the same or different.

a represents an integer of from 1 to 4.

b represents an integer of from 0 to 4.

The alkylene group, cycloalkylene group or arylene group represented by $A_2$ is the same as the alkylene group, cycloalkylene group or arylene group represented by $A_1$.

a preferably represents 1 or 2.

b preferably represents from 0 to 2.

The sulfonic acid represented by formula (I) is most preferably a sulfonic acid represented by any of formulae (Ia) to (Ih).

(Ia)

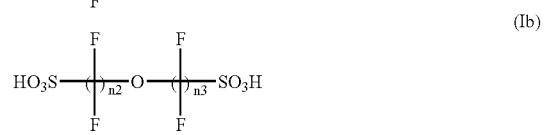
(Ib)

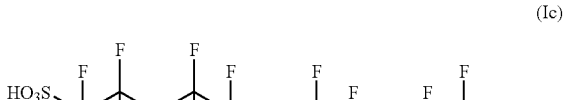
(Ic)

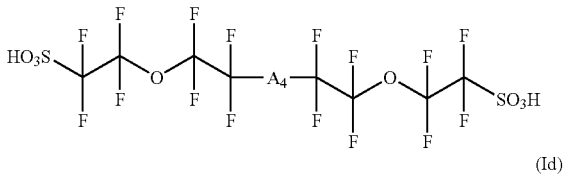
(Id)

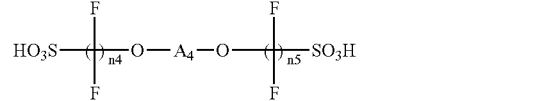
(Ie)

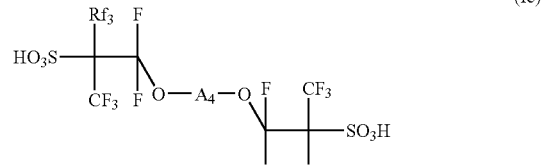

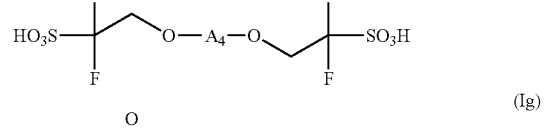
(If)

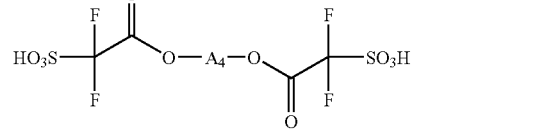
(Ig)

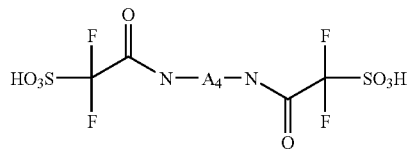

In the above formulae, A₄ represents an alkylene group, a cycloalkylene group, an arylene group, or a group obtained by linking a plurality of these groups with at least one of a single bond, an ether bond, an ester bond, an amido bond, a sulfide bond and a urea bond.

n1, n2, n3, n4 and n5 each besides represents an integer of from 1 to 8, preferably an integer of from 1 to 4.

$Rf_3$ represents a fluorine atom or a fluoroalkyl group.

The alkylene group, cycloalkylene group and arylene group represented by $A_4$ are the same as the alkylene group, cycloalkylene group and arylene group represented by $A_1$.

The fluoroalkyl group represented by $Rf_3$ is the same as the fluoroalkyl group described above.

The specific examples of preferred sulfonic acids represented by formula (I) are shown below.

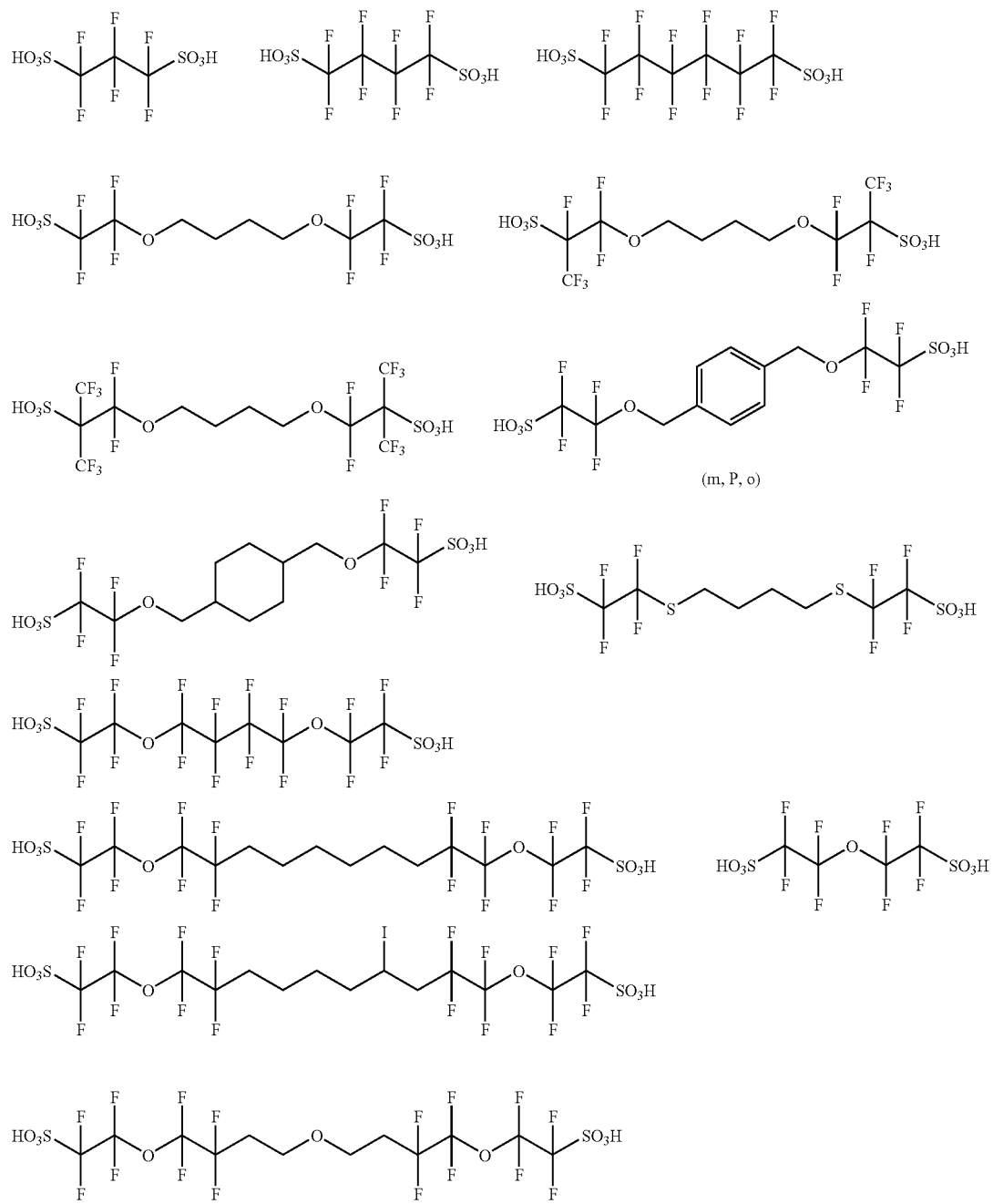

-continued
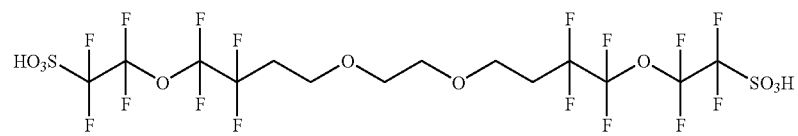
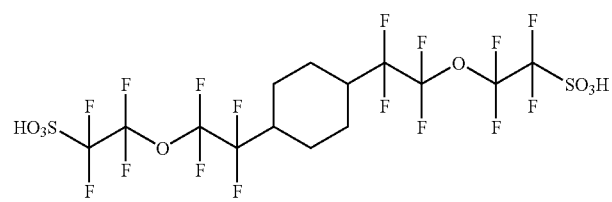
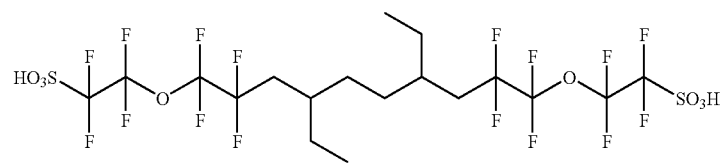
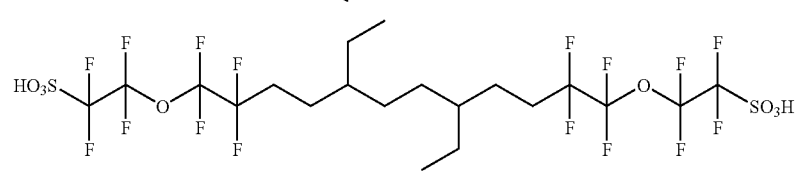
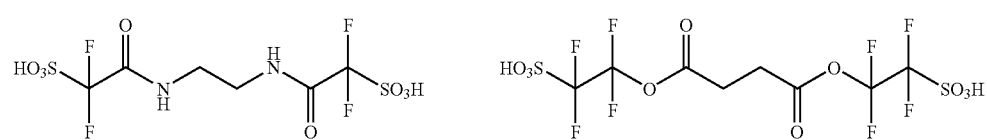
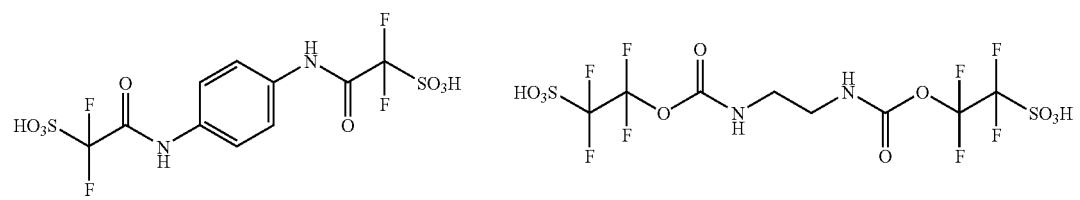
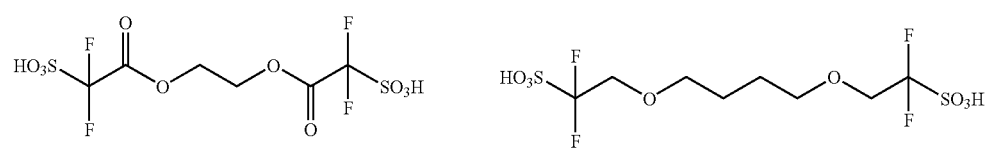
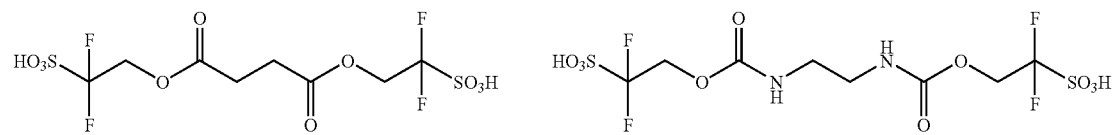
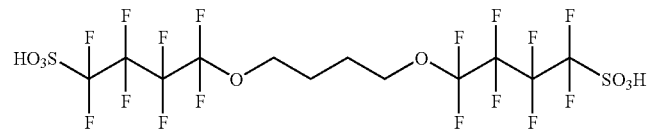
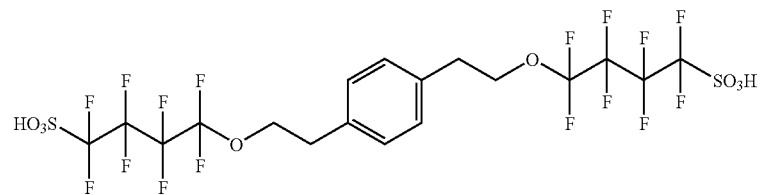

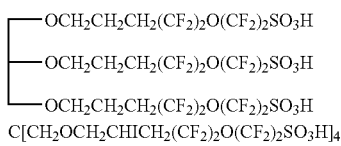
C[CH₂OCH₂CHICH₂(CF₂)₂O(CF₂)₂SO₃H]₄

-continued

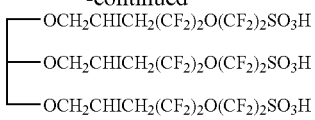

C[CH₂OCH₂CH₂CH₂(CF₂)₂O(CF₂)₂SO₃H]₄

As compound (B) capable of generating a sulfonic acid represented by formula (I) upon irradiation with an actinic ray or radiation, a compound selected from sulfonium salt compounds or iodonium salt compounds of a sulfonic acid represented by formula (I), or a compound selected from ester compounds of a sulfonic acid represented by formula (I) is preferred, and a compound represented by any of the following formulae (A-1) to (A-5) is more preferred.

(A-1)
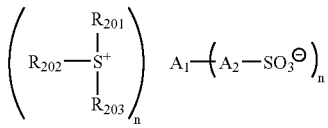

(A-2)
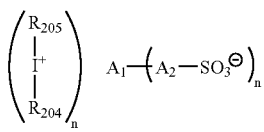

(A-3)
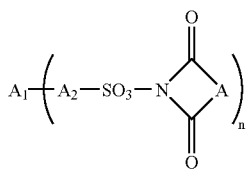

(A-4)
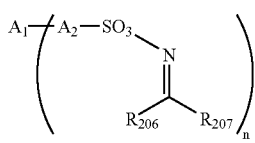

(A-5)
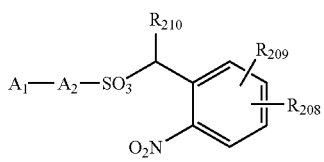

In formula (A-1), $R_{201}$, $R_{202}$ and $R_{203}$ each independently represents an organic group.

The organic groups represented by $R_{201}$, $R_{202}$ and $R_{203}$ have from 1 to 30 carbon atoms, preferably from 1 to 20 carbon atoms.

Two of $R_{201}$, $R_{202}$ and $R_{203}$ may be bonded to each other to form a cyclic structure, and an oxygen atom, a sulfur atom, an ester bond, an amido bond, or a carbonyl group may be contained in the ring.

As the group formed by the bonding of two of $R_{201}$, $R_{202}$ and $R_{203}$, an alkylene group (e.g., a butylene group and a pentylene group) is exemplified.

As the specific examples of the organic groups represented by $R_{201}$, $R_{202}$ and $R_{203}$, the corresponding groups in the later-described compounds (A-1a) to (A-1c) are exemplified.

A compound represented by formula (A-1) may have a plurality of structures represented by formula (A-1). For example, a compound may have a structure such that at least one of $R_{201}$, $R_{202}$ and $R_{203}$ of a compound represented by formula (A-1) may be bonded to at least one of $R_{201}$, $R_{202}$ and $R_{203}$ of another compound represented by formula (A-1).

As further preferred component (A-1), compounds (A-1a), (A-1b) and (A-1c) described below can be exemplified.

Compound (A-1a) is an arylsulfonium compound that at least one of $R_{201}$ to $R_{203}$ in formula (A-1) represents an aryl group, i.e., a compound having arylsulfonium as a cation.

All of $R_{201}$ to $R_{203}$ of the arylsulfonium compound may be aryl groups, or a part of $R_{201}$ to $R_{203}$ represents an aryl group and the remaining may represent an alkyl group or a cycloalkyl group.

The examples of the arylsulfonium compounds include, e.g., a triarylsulfonium compound, a diarylalkylsulfonium compound and an aryldialkylsulfonium compound.

As the aryl group of the arylsulfonium compound, a phenyl group and a naphthyl group are preferred, and a phenyl group is more preferred. When the arylsulfonium compound has two or more aryl groups, these two or more aryl groups may be the same or different.

An alkyl group or a cycloalkyl group that the arylsulfonium compound may have according to necessity is preferably a straight chain or branched alkyl group having from 1 to 15 carbon atoms or a cycloalkyl group having from 3 to 15 carbon atoms, e.g., a methyl group, an ethyl group, a propyl group, an n-butyl group, a sec-butyl group, a t-butyl group, a cyclopropyl group, a cyclobutyl group and a cyclohexyl group are exemplified.

The aryl group and the alkyl group represented by $R_{201}$, $R_{202}$ and $R_{203}$ may have, as the substituents, an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, or a phenylthio group. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the most preferred substituents are an alkyl group having from 1 to 4 carbon atoms and an alkoxyl group having from 1 to 4 carbon atoms. A substituent may be substituted on any one of $R_{201}$, $R_{202}$ and $R_{203}$, or may be substituted on all of $R_{201}$, $R_{202}$ and $R_{203}$. When each of $R_{201}$ to $R_{203}$ represents an aryl group, it is preferred that a substituent be substituted on the p-position of the aryl group.

In the next place, compound (A-1b) is described below.

Compound (A-1b) is a compound in the case where $R_{201}$, $R_{202}$ and $R_{203}$ in formula (A-1) each represents an organic group not containing an aromatic ring. The aromatic ring here also includes aromatic rings containing hetero atoms.

The organic groups not containing an aromatic ring represented by $R_{201}$, $R_{202}$ and $R_{203}$ generally have from 1 to 30 carbon atoms, preferably from 1 to 20 carbon atoms.

$R_{201}$, $R_{202}$ and $R_{203}$ each preferably represents an alkyl group, a cycloalkyl group (in particular, a straight chain, branched or cyclic oxoalkyl group that may have a double bond in the chain, and an alkoxycarbonylmethyl group are also preferred), an allyl group, or a vinyl group, more preferably a straight chain, branched or cyclic 2-oxoalkyl group, and most preferably a straight chain or branched 2-oxoalkyl group.

The alkyl group represented by $R_{201}$ to $R_{203}$ is preferably a straight chain or branched alkyl group having from 1 to 20 carbon atoms (e.g., a methyl group, an ethyl group, a propyl group, a butyl group, and a pentyl group).

The cycloalkyl group represented by $R_{201}$ to $R_{203}$ is preferably a cyclic alkyl group having from 3 to 10 carbon atoms (e.g., a cyclopentyl group, a cyclohexyl group and a norbonyl group).

The 2-oxoalkyl group represented by $R_{201}$ to $R_{203}$ may be any of straight chain, branched and cyclic groups, and groups having >C=O on the 2-position of the above alkyl group and cycloalkyl group can be exemplified as preferred groups.

As the alkoxyl group in the alkoxycarbonylmethyl group represented by $R_{201}$ to $R_{203}$, preferably an alkyl group having from 1 to 5 carbon atoms (e.g., a methyl group, an ethyl group, a propyl group, a butyl group and a pentyl group) can be exemplified.

The groups represented by $R_{201}$ to $R_{203}$ may further be substituted with a halogen atom, an alkoxyl group (e.g., an alkoxyl group having from 1 to 5 carbon atoms), a hydroxyl group, a cyano group or a nitro group.

Two of $R_{201}$ to $R_{203}$ may be bonded to each other to form a cyclic structure, and an oxygen atom, a sulfur atom, an ester bond, an amido bond, or a carbonyl group may be contained in the ring. As the group formed by the bonding of two of $R_{201}$, $R_{202}$ and $R_{203}$, an alkylene group (e.g., a butylene group and a pentylene group) is exemplified.

Compound (A-1c) is a compound represented by the following formula (A-1c) having an arylacylsulfonium salt structure.

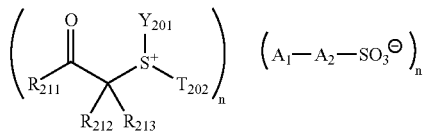

In formula (A-1c), $R_{211}$ represents an aryl group, preferably a phenyl group or a naphthyl group. As the substituents that the aryl group represented by $R_{211}$ may have, an alkyl group, a cycloalkyl group, an alkoxyl group, an acyl group, a nitro group, a hydroxyl group, an alkoxycarbonyl group and a carboxyl group are exemplified.

$R_{212}$ and $R_{213}$ each represents a hydrogen atom, an alkyl group or a cycloalkyl group.

$Y_{201}$ and $Y_{202}$ each independently represents an alkyl group (in particular, a 2-oxoalkyl group, an alkoxycarbonylalkyl group, and a carboxyalkyl group are preferred), a cycloalkyl group (in particular, a 2-oxocycloalkyl group, an alkoxycarbonylcyclo-alkyl group, and a carboxycycloalkyl group are preferred), an aryl group, or a vinyl group.

$R_{211}$ and $R_{212}$ may be bonded to each other to form a cyclic structure, $R_{212}$ and $R_{213}$ may be bonded to each other to form a cyclic structure, and $Y_{201}$ and $Y_{202}$ may be bonded to each other to form a cyclic structure. These cyclic structures may contain an oxygen atom, a sulfur atom, an ester bond or an amido bond.

The alkyl group represented by $Y_{201}$ and $Y_{202}$ is preferably an alkyl group having from 1 to 20 carbon atoms.

The cycloalkyl group represented by $Y_{201}$ and $Y_{202}$ is preferably a cycloalkyl group having from 3 to 20 carbon atoms.

As the 2-oxoalkyl group represented by $Y_{201}$ and $Y_{202}$, a group having >C=O on the 2-position of the alkyl group represented by $Y_{201}$ and $Y_{202}$ can be exemplified.

As the 2-oxocycloalkyl group, a group having >C=O on the 2-position of the cycloalkyl group represented by $Y_{201}$ and $Y_{202}$ can be exemplified.

The alkoxycarbonyl group in the alkoxycarbonylalkyl group and the alkoxycarbonylcycloalkyl group is preferably an alkoxycarbonyl group having from 2 to 20 carbon atoms.

As the groups formed by the bonding of $Y_{201}$ and $Y_{202}$, a butylene group and a pentylene group can be exemplified.

$Y_{201}$ and $Y_{202}$ each preferably represents an alkyl group or a cycloalkyl group having 4 or more carbon atoms, more preferably from 4 to 16, and still more preferably an alkyl group or a cycloalkyl group having from 4 to 12 carbon atoms.

It is also preferred that at least one of $R_{212}$ and $R_{213}$ represent an alkyl group or a cycloalkyl group, and it is more preferred that both $R_{212}$ and $R_{213}$ represent an alkyl group or a cycloalkyl group.

In formula (A-2), $R_{204}$ and $R_{205}$ each represents an aryl group, an alkyl group or a cycloalkyl group.

As the aryl group represented by $R_{204}$ and $R_{205}$, a phenyl group and a naphthyl group are preferred, and a phenyl group is more preferred.

The alkyl group represented by $R_{204}$ and $R_{205}$ is preferably a straight chain or branched alkyl group having from 1 to 10 carbon atoms (e.g., a methyl group, an ethyl group, a propyl group, a butyl group, or a pentyl group).

The cycloalkyl group represented by $R_{204}$ and $R_{205}$ is preferably a cycloalkyl group having from 3 to 10 carbon atoms (e.g., a cyclopentyl group, a cyclohexyl group, or a norbonyl group).

As the substituents that the groups represented by $R_{204}$ and $R_{205}$ may have, e.g., an alkyl group (e.g., having from 1 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

In formula (A-3), A represents an alkylene group, an alkenylene group or an arylene group.

In formula (A-4), $R_{206}$ represents an alkyl group, a cycloalkyl group, or an aryl group; and $R_{207}$ represents an alkyl group (in particular, an oxoalkyl group is preferred), a cycloalkyl group (in particular, an oxocycloalkyl group is preferred), a cyano group, or an alkoxycarbonyl group, and preferably represents a halogen-substituted alkyl group, a halogen-substituted cycloalkyl group or a cyano group.

In formula (A-5), $R_{208}$ and $R_{209}$ each represents a hydrogen atom, an alkyl group, a cycloalkyl group, a cyano group, a nitro group or an alkoxycarbonyl group, and preferably represents a halogen-substituted alkyl group, a halogen-substituted cycloalkyl group, a nitro group or a cyano group; and $R_{210}$ represents a hydrogen atom, an alkyl group, a cycloalkyl group, a cyano group, or an alkoxycarbonyl group.

The most preferred compound (B) is a compound represented by formula (A-1).

The specific examples of compound (B1) are shown below, but the present invention is not limited thereto.

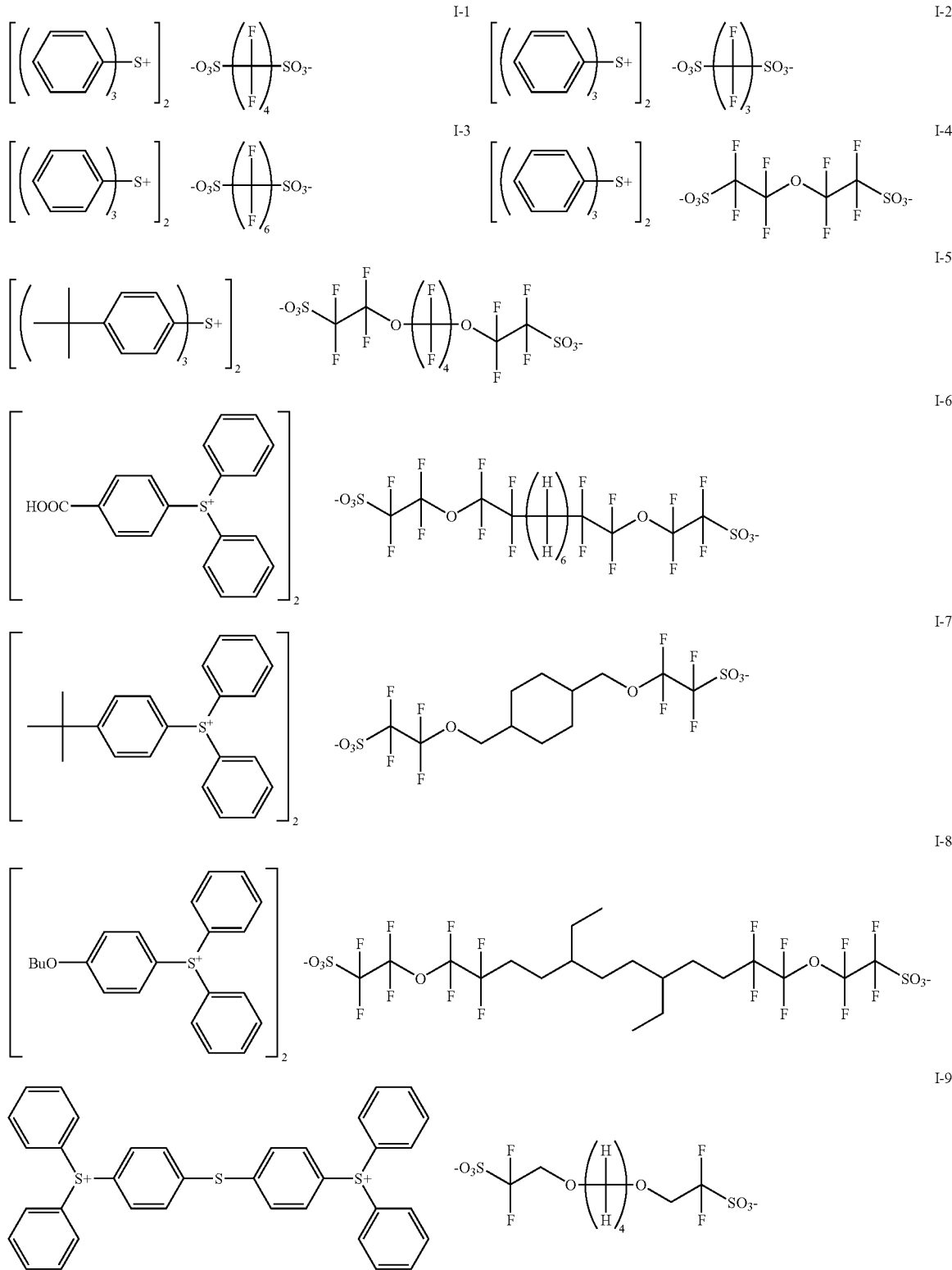

-continued
| | |
|---|---|
| 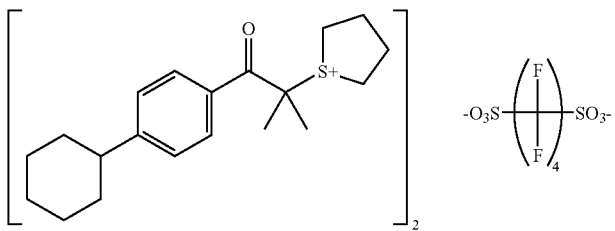 | 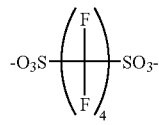 I-10 |
| 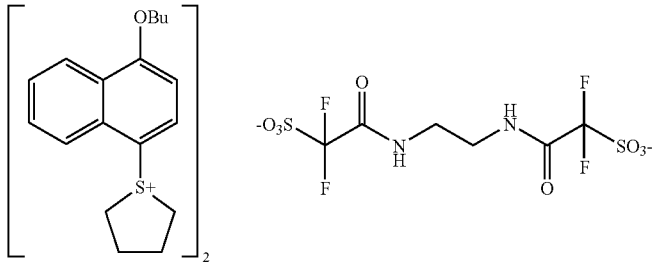 | 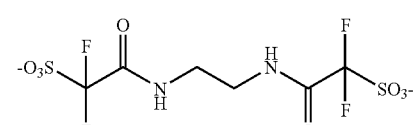 I-11 |
| 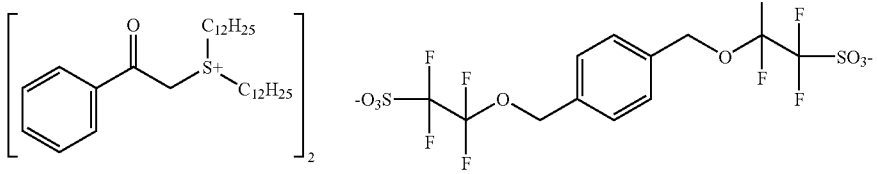 | 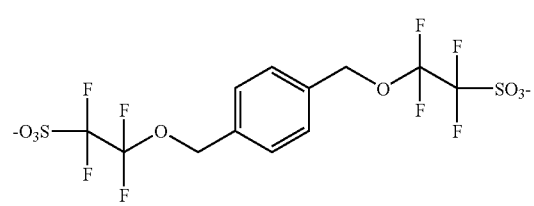 I-12 |
| 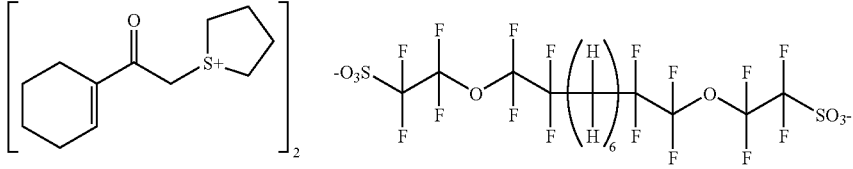 | 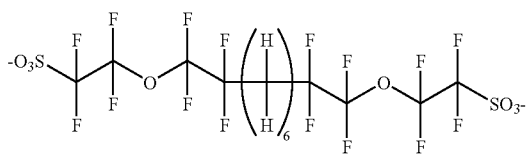 I-13 |
| 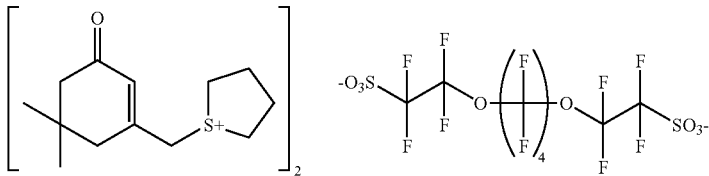 | 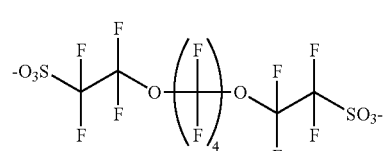 I-14 |
| 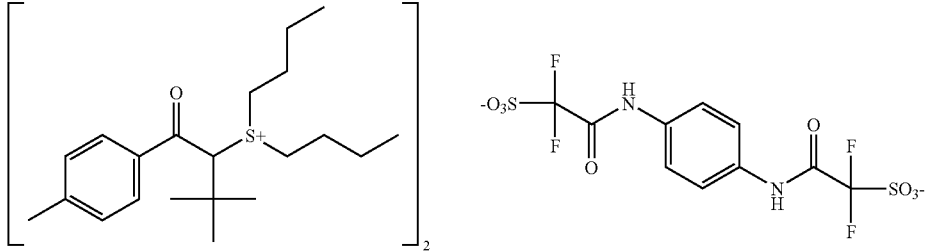 | 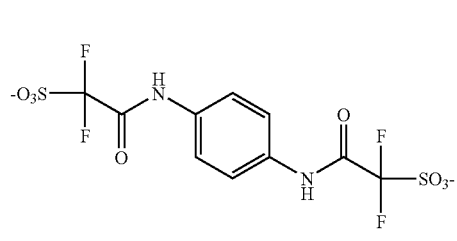 I-15 |
| 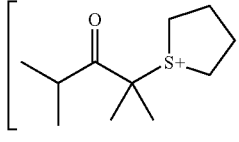 | 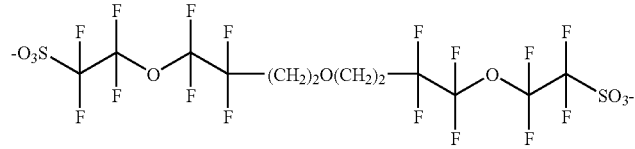 I-16 |

-continued
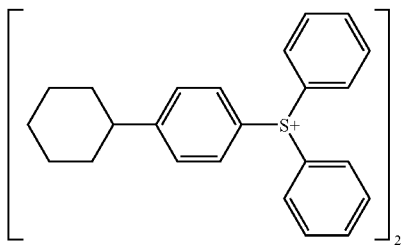 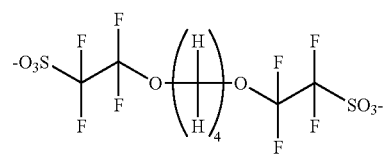 I-17
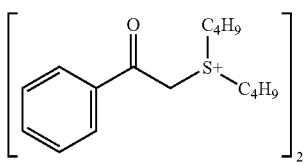 I-18 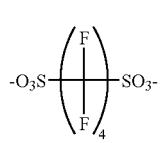 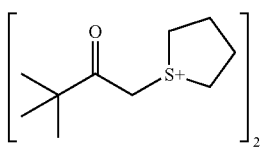 I-19
 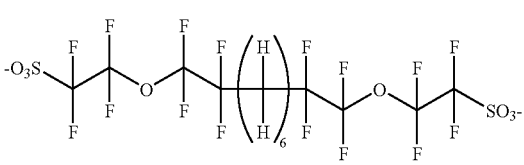 I-20
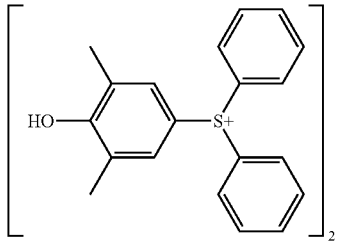 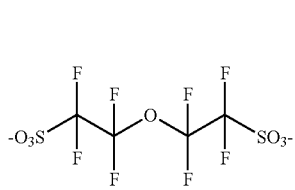 I-21
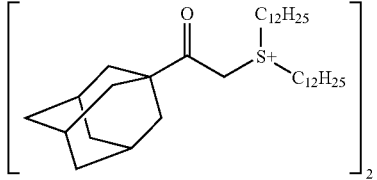 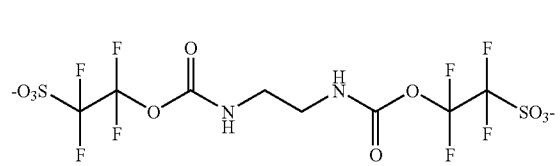 I-22
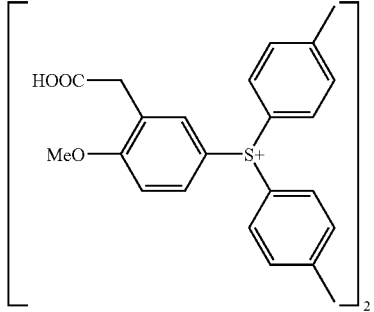 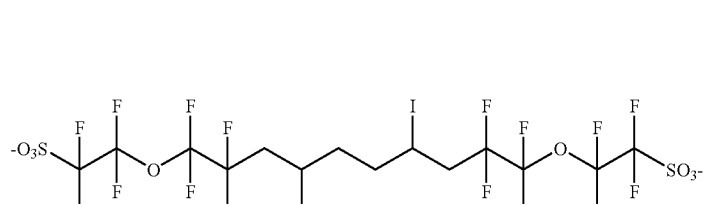 I-23
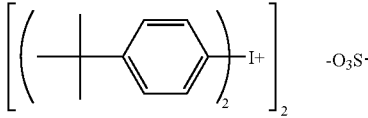 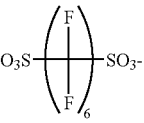 I-24

-continued

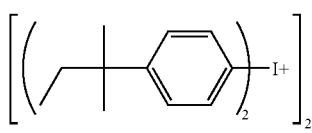 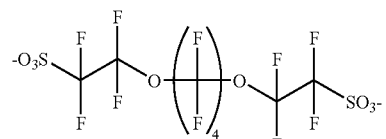

I-25

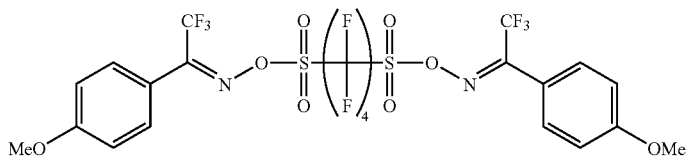

I-26

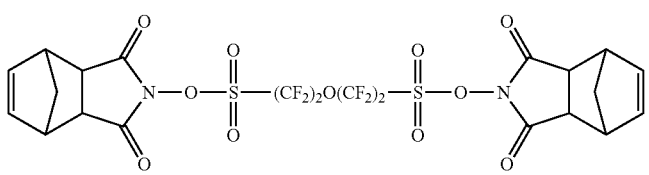

I-27

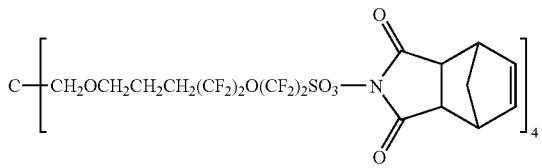 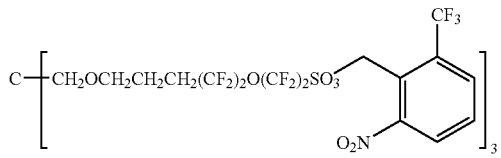

I-28            I-29

Compound (B1) can be synthesized by synthesizing the derivative of a sulfonic acid represented by formula (I), and then salt exchange with onium halide or esterification with a hydroxyl group-containing compound. The derivative of a sulfonic acid represented by formula (I) can be synthesized according to the methods described, e.g., in JP-A-2001-322975, *J. Org. Chem.*, Vol. 56, No. 22, p. 6348 (1991), and *Synthesis*, p. 464 (1989).

The content of compound (B1) in the positive resist composition according to the invention is preferably from 0.1 to 20 weight % on the basis of the solids content of the composition, more preferably from 0.5 to 10 weight %, and still more preferably from 1 to 7 weight %.

Acid-Generating Agent for Use in Combination:

Besides compound (B1), compound (B2) capable of decomposing and generating an acid upon irradiation with an actinic ray or radiation may further be used in combination in the present invention.

The amount of a light-acid generating agent to be used in combination is generally from 100/0 to 20/80 in the molar ratio of [compound (B1)/other acid-generating agent (B2)], preferably from 100/0 to 40/60, and still more preferably from 100/0 to 50/50.

As such light-acid generating agents usable in combination, photo-initiators of photo-cationic polymerization, photo-initiators of photo-radical polymerization, photo-decoloring agents of dyestuffs, photo-discoloring agents, or well-known compounds capable of generating an acid upon irradiation with an actinic ray or radiation which are used in the manufacture of micro-resist, and mixtures of these compounds can be used by arbitrary selection.

For instance, diazonium salt, phosphonium salt, sulfonium salt, iodonium salt, imidosulfonate, oximesulfonate, diazodisulfone, disulfone and o-nitrobenzylsulfonate can be exemplified as such light-acid generating agents.

Compounds to the main chain or side chain of which are introduced groups or compounds capable of generating an acid upon irradiation with an actinic ray or radiation, e.g., the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can also be used.

Further, the compounds capable of generating an acid by light as disclosed in U.S. Pat. No. 3,779,778 and EP-126,712 can also be used.

Of the compounds capable of decomposing and generating an acid upon irradiation with an actinic ray or radiation and usable in combination, the compounds represented by the following formula (ZI), (ZII) or (ZIII) can be exemplified as preferred compounds.

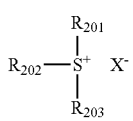

ZI

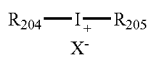

ZII

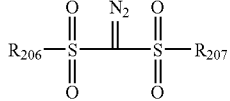

ZIII

In formula (ZI), $R_{201}$, $R_{202}$ and $R_{203}$ each independently represents an organic group.

The organic groups represented by $R_{201}$, $R_{202}$ and $R_{203}$ generally have from 1 to 30 carbon atoms, preferably from 1 to 20 carbon atoms.

Two of $R_{201}$, $R_{202}$ and $R_{203}$ may be bonded to each other to form a cyclic structure, and an oxygen atom, a sulfur atom, an ester bond, an amido bond, or a carbonyl group may be contained in the ring.

As the group formed by the bonding of two of $R_{201}$, $R_{202}$ and $R_{203}$, an alkylene group (e.g., a butylene group and a pentylene group) can be exemplified.

$X^-$ represents a non-nucleophilic anion.

The examples of non-nucleophilic anions represented by $X^-$ include, e.g., a sulfonate anion, a carboxylate anion, a sulfonylimido anion, a bis(alkylsulfonyl)imido anion, and a tris(alkylsulfonyl)methyl anion.

A non-nucleophilic anion is an anion having extremely low ability of causing a nucleophilic reaction and capable of restraining the decomposition of a resin by aging due to an intramolecular nucleophilic reaction, thus the aging stability of a resist is improved.

As sulfonate anions, .g., an alkylsulfonate anion, an arylsulfonate anion and a camphor sulfonate anion are exemplified.

As carboxylate anions, e.g., an alkylcarboxylate anion, an arylcarboxylate anion and an aralkylcarboxylate anion are exemplified.

The alkyl moiety in an alkylsulfonate anion may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group and a boronyl group are exemplified.

The aryl group in an arylsulfonate anion is preferably an aryl group having from 6 to 14 carbon atoms, e.g., a phenyl group, a tolyl group, and a naphthyl group are exemplified.

The alkyl group, cycloalkyl group and aryl group in the above alkylsulfonate anion and arylsulfonate anion may have a substituent.

As the examples of the substituents, e.g., a nitro group, a halogen atom (a fluorine atom, a chlorine atom, a bromine atom, and an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) are exemplified. With respect to the aryl group and the cyclic structure that each group may have, an alkyl group (preferably having from 1 to 15 carbon atoms) is further exemplified as the substituent.

As the alkyl moiety in an alkylcarboxylate anion, the same alkyl group and cycloalkyl group as in the alkylsulfonate anion can be exemplified.

As the aryl moiety in an arylcarboxylate anion, the same aryl group as in the arylsulfonate anion can be exemplified.

As the aralkyl group in an aralkylcarboxylate anion, preferably an aralkyl group having from 6 to 12 carbon atoms, e.g., a benzyl group, a phenethyl group, a naphthylmethyl group, a naphthylethyl group, and a naphthylmethyl group can be exemplified.

The alkyl group, cycloalkyl group, aryl group and aralkyl groups in the alkylcarboxylate anion, arylcarboxylate anion and aralkylcarboxylate anion may have a substituent, e.g., the same halogen atom, alkyl group, cycloalkyl group, alkoxyl group and alkylthio group as in the arylsulfonate anion can be exemplified as the substituents.

As a sulfonylimido anion, e.g., a saccharin anion can be exemplified.

The alkyl group in a bis(alkylsulfonyl)imido anion, and a tris(alkylsulfonyl)methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group are exemplified. These alkyl groups may have a substituent, and the examples of the substituents include a halogen atom, a halogen-substituted alkyl group, an alkoxyl group, and an alkylthio group. A fluorine-substituted alkyl group is preferred.

As other non-nucleophilic anions, e.g., fluorinated phosphorus, fluorinated boron and fluorinated antimony can be exemplified.

As the non-nucleophilic anions represented by $X^-$, an alkanesulfonate anion in which the α-position of the sulfonic acid is substituted with a fluorine atom, an arylsulfonate anion substituted with a fluorine atom or a group having a fluorine atom, a bis(alkylsulfonyl)imido anion the alkyl group of which is substituted with a fluorine atom, and a tris(alkylsulfonyl)methide anion the alkyl group of which is substituted with a fluorine atom are preferred. Particularly preferred non-nucleophilic anions are a perfluoroalkanesulfonate anion having from 4 to 8 carbon atoms and a benzenesulfonate anion having a fluorine atom, and most preferred non-nucleophilic anions are a nonafluorobutanesulfonate anion, a perfluorooctanesulfonate anion, a pentafluorobenzenesulfonate anion, and a 3,5-bis(trifluoro-methyl)benzenesulfonate anion.

As the specific examples of the organic groups represented by $R_{201}$, $R_{202}$ and $R_{203}$, the corresponding groups in the later-described compounds (ZI-1), (ZI-2) and (ZI-3) are exemplified.

A compound represented by formula (ZI) may have a plurality of structures represented by formula (ZI). For example, a compound may have a structure such that at least one of $R_{201}$, $R_{202}$ and $R_{203}$ of a compound represented by formula (ZI) may be bonded to at least one of $R_{201}$, $R_{202}$ and $R_{203}$ of another compound represented by formula (ZI).

As further preferred component (ZI), compounds (ZI-1), (ZI-2) and (ZI-3) described below can be exemplified.

Compound (ZI-1) is an arylsulfonium compound that at least one of $R_{201}$ to $R_{203}$ in formula (ZI) represents an aryl group, i.e., a compound having arylsulfonium as a cation.

All of $R_{201}$ to $R_{203}$ of the arylsulfonium compound may be aryl groups, or a part of $R_{201}$ to $R_{203}$ represents an aryl group and the remaining may represent an alkyl group or a cycloalkyl group.

The examples of the arylsulfonium compounds include, e.g., a triarylsulfonium compound, a diarylalkylsulfonium compound and an aryldialkylsulfonium compound.

As the aryl group of the arylsulfonium compound, a phenyl group and a naphthyl group are preferably used, and a phenyl group is more preferred. When the arylsulfonium compound has two or more aryl groups, these two or more aryl groups may be the same or different.

An alkyl group or a cycloalkyl group that the arylsulfonium compound may have according to necessity is preferably a straight chain or branched alkyl group having from 1 to 15 carbon atoms or a cycloalkyl group having from 3 to 15 carbon atoms, e.g., a methyl group, an ethyl group, a propyl group, an n-butyl group, a sec-butyl group, a t-butyl group, a cyclopropyl group, a cyclobutyl group and a cyclohexyl group are exemplified.

The aryl group, alkyl group and cycloalkyl group represented by $R_{201}$, $R_{202}$ and $R_{203}$ may have, as the substituents, an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, or a phenylthio group. The preferred substituents are a straight chain or branched alkyl group having from 1 to 12 carbon atoms, a cycloalkyl group having from 3 to 12 carbon atoms, and a straight chain, branched or cyclic alkoxyl group having from 1 to 12 carbon atoms, and the most preferred substituents are an alkyl group having from 1 to 4 carbon atoms and an alkoxyl group having from 1 to 4 carbon atoms. A substituent may be substituted on any one of $R_{201}$, $R_{202}$ and $R_{203}$, or may be substituted on all of $R_{201}$, $R_{202}$ and $R_{203}$. When each of $R_{201}$ to $R_{203}$ represents an aryl group, it is preferred that a substituent be substituted on the p-position of the aryl group.

In the next place, compound (ZI-2) is described below.

Compound (ZI-2) is a compound in the case where $R_{201}$, $R_{202}$ and $R_{203}$ in formula (ZI) each represents an organic group not containing an aromatic ring. The aromatic ring here also includes aromatic rings containing hetero atoms.

The organic groups not containing an aromatic ring represented by $R_{201}$, $R_{202}$ and $R_{203}$ generally have from 1 to 30 carbon atoms, preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain or branched 2-oxoalkyl group, a 2-oxocycloalkyl group or an alkoxycarbonylmethyl group, and most preferably a straight chain or branched 2-oxoalkyl group.

The alkyl group and cycloalkyl group represented by $R_{201}$ to $R_{203}$ are preferably a straight chain or branched alkyl group having from 1 to 10 carbon atoms (e.g., a methyl group, an ethyl group, a propyl group, a butyl group, and a pentyl group), and a cycloalkyl group having from 3 to 10 carbon atoms (e.g., a cyclopentyl group, a cyclohexyl group and a norbonyl group). The alkyl group is more preferably a 2-oxoalkyl group or an alkoxycarbonylmethyl group.

The 2-oxoalkyl group may be either a straight chain or branched group, and a group having >C=O on the 2-position of the above alkyl group can be exemplified as a preferred group The 2-oxocycloalkyl group is preferably a group having >C=O on the 2-position of the above cycloalkyl group.

As the alkoxyl group in the alkoxycarbonylmethyl group, preferably an alkyl group having from 1 to 5 carbon atoms (e.g., a methyl group, an ethyl group, a propyl group, a butyl group and a pentyl group) can be exemplified.

The groups represented by $R_{201}$ to $R_{203}$ may further be substituted with a halogen atom, an alkoxyl group (e.g., an alkoxyl group having from 1 to 5 carbon atoms), a hydroxyl group, a cyano group or a nitro group.

Two of $R_{201}$ to $R_{203}$ may be bonded to each other to form a cyclic structure, and an oxygen atom, a sulfur atom, an ester bond, an amido bond, or a carbonyl group may be contained in the ring. As the group formed by the bonding of two of $R_{201}$, $R_{202}$ and $R_{203}$, an alkylene group (e.g., a butylene group and a pentylene group) is exemplified.

Compound (ZI-3) is a compound represented by the following formula (ZI-3) and having a phenacylsulfonium salt structure.

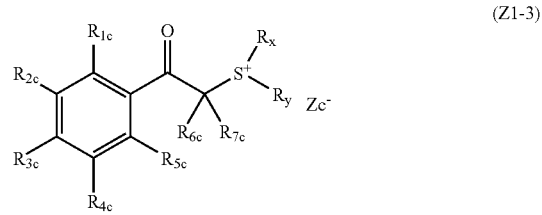

(ZI-3)

In formula (ZI-3), $R_{1c}$, $R_{2c}$, $R_{3c}$, $R_{4c}$ and $R_{5c}$ each independently represents a hydrogen atom, an alkyl group, a cycloalkyl group, an alkoxyl group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more of $R_{1c}$ to $R_5c$, and $R_x$ and $R_y$ may be bonded to each other to form a cyclic structure, and the cyclic structure may contain an oxygen atom, a sulfur atom, an ester bond or an amido bond.

$Zc^-$ represents a non-nucleophilic anion, and as the non-nucleophilic anion represented by $Zc^-$, the same groups as described in the non-nucleophilic anion represented by $X^-$ in formula (ZI) can be exemplified.

The alkyl group represented by $R_{1c}$ to $R_{5c}$ may be straight chain or branched, e.g., an alkyl group having from 1 to 20 carbon atoms, and preferably a straight or branched alkyl group from 1 to 12 carbon atoms (e.g., a methyl group, an ethyl group, a straight chain or branched propyl group, a straight chain or branched butyl group, and a straight chain or branched pentyl group) can be exemplified.

As the cycloalkyl group, e.g., a cyclic alkyl group having from 3 to 8 carbon atoms (e.g., a cyclopentyl group and a cyclohexyl group) can be exemplified.

The alkoxyl group represented by $R_{1c}$ to $R_{5c}$ may be any of straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), and a cyclic alkoxyl group having from 3 to 8 carbon atoms (e.g., a cyclopentyloxy group and a cyclohexyloxy group) are exemplified.

It is preferred that any of $R_{1c}$ to $R_{5c}$ represent a straight chain or branched alkyl group, a cycloalkyl group, or a straight chain, branched or cyclic alkoxyl group, and it is more preferred that the sum total of the carbon atom numbers of $R_{1c}$ to $R_{5c}$ be from 2 to 15, by which the solubility in a solvent is improved and the generation of particles can be restrained during storage.

As the alkyl group and cycloalkyl group represented by $R_x$ and $R_y$, the same alkyl group and cycloalkyl group as represented by $R_{1c}$ to $R_{5c}$ can be exemplified, and a 2-oxoalkyl group, a 2-oxocycloalkyl group and an alkoxycarbonylmethyl group are more preferred.

As the 2-oxoalkyl group and the 2-oxocycloalkyl group, groups having >C=O on the 2-position of the alkyl group and the cycloalkyl group represented by $R_{1c}$ to $R_{5c}$ can be exemplified.

As the alkoxyl group in the alkoxycarbonylmethyl group, the same groups as the alkoxyl group represented by $R_{1c}$ to $R_{5c}$ can be exemplified.

As the groups formed by the bonding of $R_x$ and $R_y$, a butylene group and a pentylene group can be exemplified.

$R_x$ and $R_y$ each preferably represents an alkyl group having 4 or more carbon atoms or a cycloalkyl group, more preferably having 6 or more carbon atoms, and still more preferably an alkyl group having 8 or more carbon atoms, or a cycloalkyl group.

In formulae (ZII) and (ZIII), $R_{204}$, $R_{205}$, $R_{206}$ and $R_{207}$ each represents an aryl group, an alkyl group or a cycloalkyl group.

The aryl group represented by $R_{204}$ to $R_{207}$ is preferably a phenyl group or a naphthyl group, and more preferably a phenyl group.

The alkyl group and the cycloalkyl group represented by $R_{204}$ to $R_{207}$ are preferably a straight chain or branched alkyl group having from 1 to 10 carbon atoms (e.g., a methyl group, an ethyl group, a propyl group, a butyl group and a pentyl group), and a cyclic alkyl group having from 3 to 10 carbon atoms (e.g., a cyclopentyl group, a cyclohexyl group and a norbonyl group).

As the substituents that the groups represented by $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

$X^-$ in formula (ZII) represents a non-nucleophilic anion, and the same groups as the non-nucleophilic anion represented by $X^-$ in formula (ZI) can be exemplified.

Of the compounds capable of decomposing and generating an acid upon irradiation with an actinic ray or radiation and usable in combination, the compounds represented by the following formula (ZIV), (ZV) or (ZVI) can be further exemplified as preferred compounds.

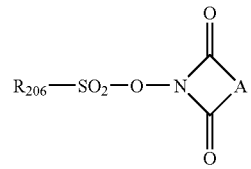

ZIV

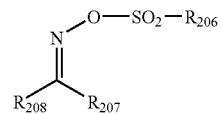

ZV

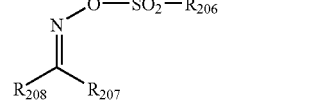

ZVI

In formulae (ZIV), (ZV) and (ZVI), $Ar_3$ and $Ar_4$ each independently represents an aryl group.

$R_{206}$, $R_{207}$ and $R_{208}$ each independently represents an alkyl group or an aryl group.

A represents an alkylene group, an alkenylene group or an arylene group.

Of the compounds capable of decomposing and generating an acid upon irradiation with an actinic ray or radiation and usable in combination, more preferred compounds are the compounds represented by formulae (ZI) to (ZIII).

As the compounds capable of decomposing and generating an acid upon irradiation with an actinic ray or radiation and usable in combination, a compound having one sulfonic acid group and generating a sulfonic acid is preferred, and a compound generating a monovalent perfluoroalkane-sulfonic acid and a compound substituted with a fluorine atom or a group containing a fluorine atom and generating an aromatic sulfonic acid are more preferred.

Of compound (B2) capable of decomposing and generating an acid upon irradiation with an actinic ray or radiation, the examples of particularly preferred compounds are shown below.

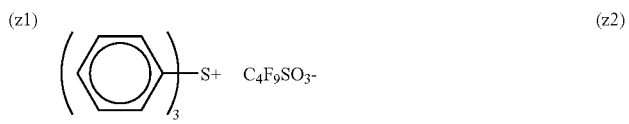

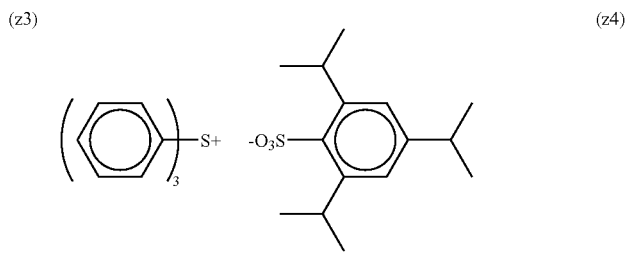

-continued
(z5)
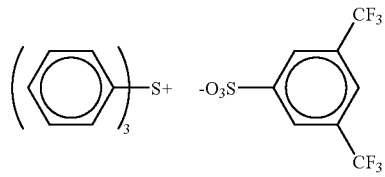
(z6)
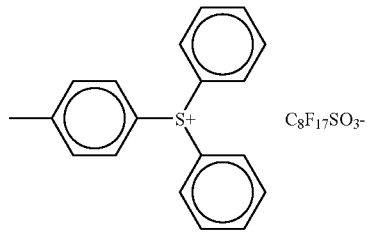
(z7)
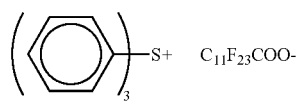
(z8)
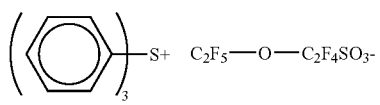
(z9)
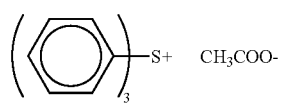
(z10)
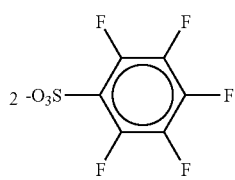
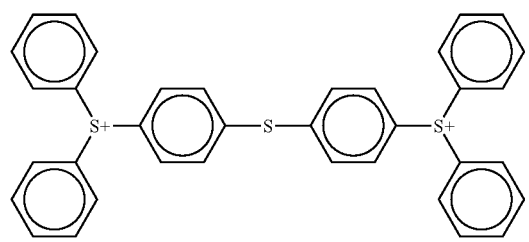
(z11)
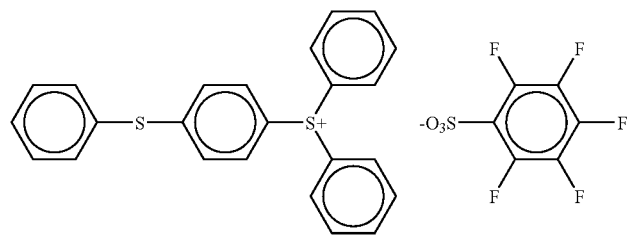
(z12)
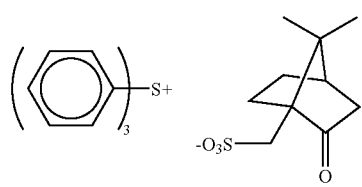
(z13)
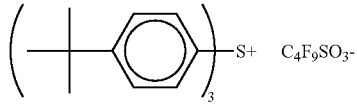
(z14)
(z15)
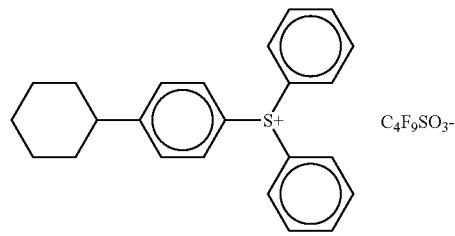
(z16)
(z17)
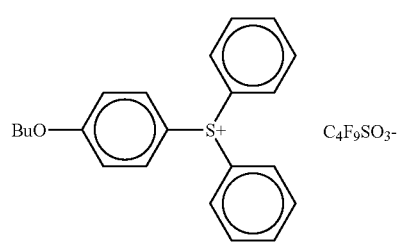
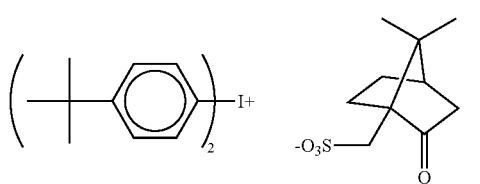

-continued
(z18)
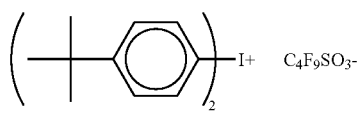
(z19)
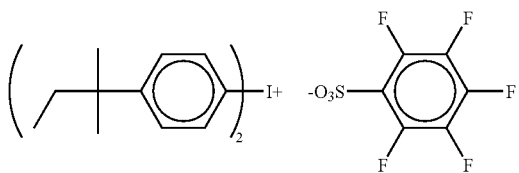
(z20)
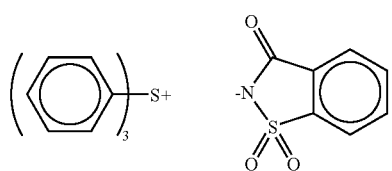
(z21)
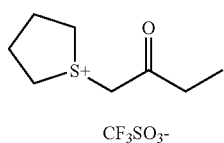
CF₃SO₃-
(z22)
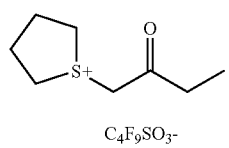
C₄F₉SO₃-
(z23)
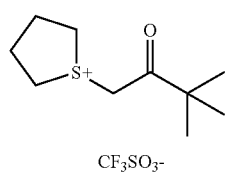
C₈F₁₇SO₃-
(z24)
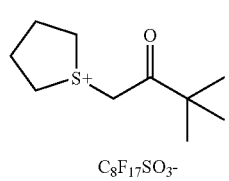
CF₃SO₃-
(z25)
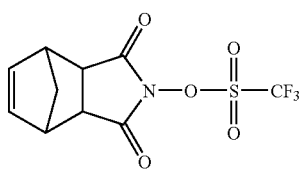
C₄F₉SO₃-
(z26)
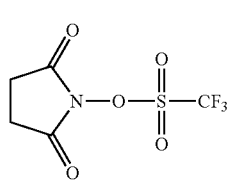
C₈F₁₇SO₃-
(z27)
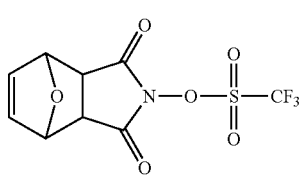
(z28)
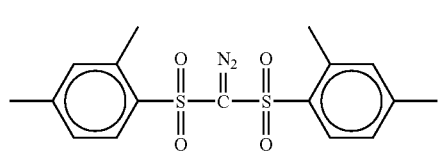
(z29)
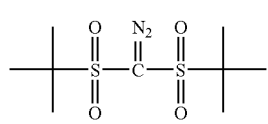
(z30)
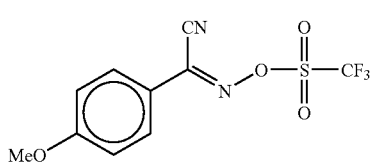
(z31)
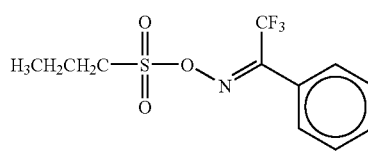
(z32)
(z33)
(z34)

-continued
(z35) 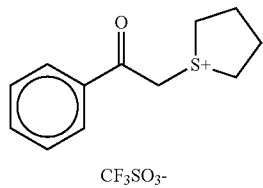
CF3SO3-
(z36) 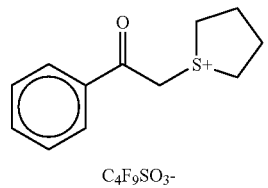
C4F9SO3-
(z37) 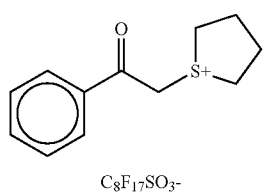
C8F17SO3-
(z38) 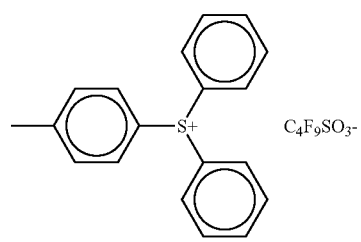
C4F9SO3-
(z39) 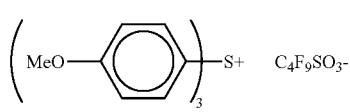 C4F9SO3-
(z40) 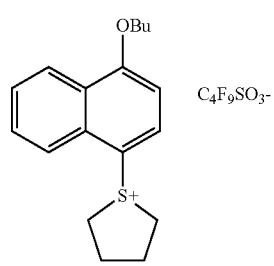
C4F9SO3-
(z41) 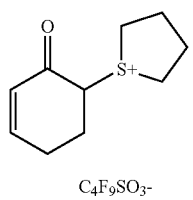
C4F9SO3-
(z42) 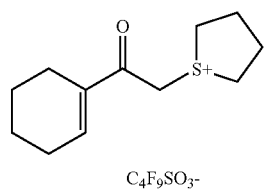
C4F9SO3-
(z43) 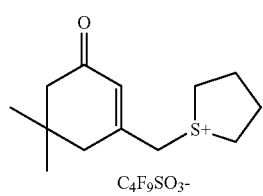
C4F9SO3-
(z44) 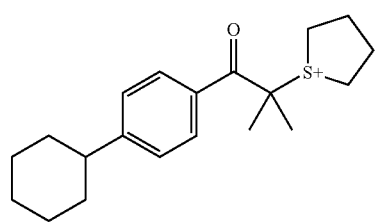
C4F9SO3-
(z45) 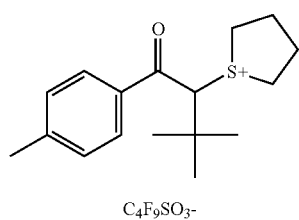
C4F9SO3-
(z46) 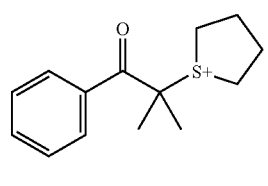
C4F9SO3-

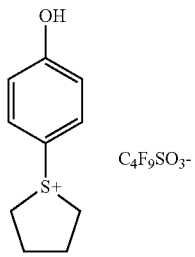
(z47)

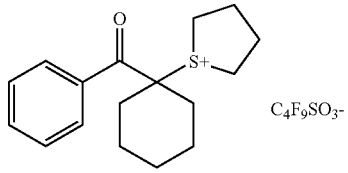
(z48)

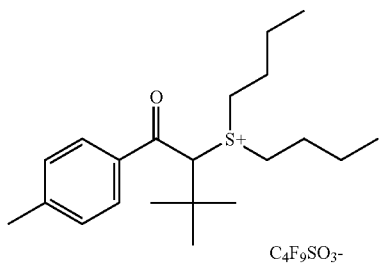
(z49)

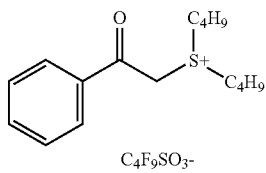
(z50)

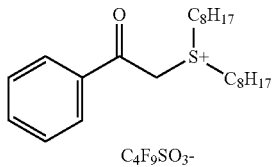
(z51)

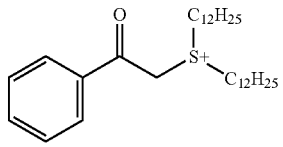
(z52)

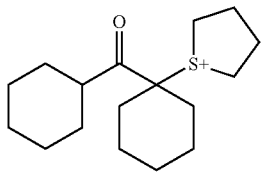
(z53)

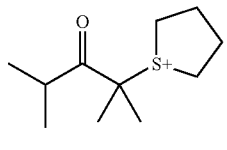
(z54)

[3] Organic Basic Compounds (Component (C)):

(C1) An amine compound having at least one aliphatic hydroxyl group and/or an ether bond in the molecule of the component:

The compound of component (C1) in the invention is a compound having at least one aliphatic hydroxyl group and/or an ether bond in the molecule. The aliphatic hydroxyl group here is a group having a hydroxyl group bonded to an arbitrary position of a straight chain or branched cyclic hydrocarbon group.

Component (C1) in the present invention is preferably an amine compound represented by formula (C-1), (C-2) or (C-3).

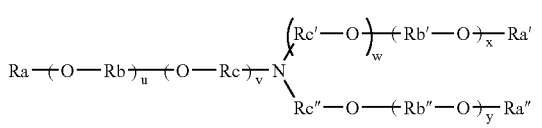
(C-1)

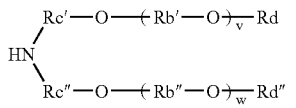
(C-2)

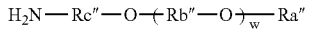
(C-3)

In formulae (C-1) to (C-3), Ra, Ra' and Ra" each independently represents a hydrogen atom, an alkyl group (preferably having from 1 to 20 carbon atoms), a cycloalkyl group (preferably having from 4 to 20 carbon atoms), or an aryl group (preferably having from 6 to 20 carbon atoms).

Each of these groups may have a substituent, and as the examples of the substituents of the alkyl group and the cycloalkyl group, an aryl group (e.g., a phenyl group and a naphthyl group), an alkoxyl group (e.g., a methoxy group, an ethoxy group and a propyloxy group), a hydroxyl group, a carboxyl group, an alkylcarbonyloxy group, and an alkyloxy-carbonyl group can be exemplified. As the examples of the substituents of the aryl group, an alkyl group (e.g., a methyl group, an ethyl group, and a propyl group), an alkoxyl group (e.g., a methoxy group, an ethoxy group and a propyloxy group), a hydroxyl group, a carboxyl group, an alkylcarbonyloxy group, an alkyloxycarbonyl group, a nitro group and a cyano group can be exemplified.

Two or more of Ra, Ra' and Ra" may be bonded to each other to form a cyclic structure.

Ra, Ra' and Ra" each more preferably represents a hydrogen atom, an alkyl group having from 1 to 12 carbon atoms, a cycloalkyl group having from 5 to 10 carbon atoms, a phenyl group or a naphthyl group, and particularly preferably represents a hydrogen atom, an alkyl group having from 1 to 6 carbon atoms (e.g., a methyl group, an ethyl group, an n-propyl group, an isopropyl group, an n-butyl group, a t-butyl group or an n-hexyl group), a cycloalkyl group having from 5 to 8 carbon atoms (e.g., a cyclopentyl group, a cyclohexyl group or a cyclooctyl group), or a phenyl group.

Rb, Rb', Rb", Rc, Rc' and Rc" may be the same or different in a case where a plurality of Rb, Rb', Rb", Rc, Rc' and Rc" are present, and each independently represents an alkylene group (preferably having from 1 to 20 carbon atoms). The alkylene group may have a substituent, and as the examples of the substituents, the same groups as described above as the examples of the substituents in the case where Ra represents an alkyl group can be exemplified. Rb, Rb', Rb", Rc, Rc' and Rc" each preferably independently represents an alkylene group having from 1 to 12 carbon atoms, and particularly preferably an alkylene group having from 1 to 6 carbon atoms (e.g., a methylene group, an ethylene group, a propylene group, a butylene group, or a hexylene group).

Rd and Rd" each independently represents a hydrogen atom, an alkyl group (preferably having from 1 to 20 carbon atoms), a cycloalkyl group (preferably having from 4 to 20 carbon atoms), or an aryl group (preferably having from 6 to 20 carbon atoms). These groups may have a substituent, and the same groups as described as the substituents of Ra, Ra' and Ra" can be exemplified as the examples of the substituents. Rd and Rd" may be bonded to each other to form a cyclic structure. Rd and Rd" each preferably represents a hydrogen atom, an alkyl group having from 1 to 12 carbon atoms, a cycloalkyl group having from 5 to 10 carbon atoms, a phenyl group or a napnthyl group, and particularly preferably represents a hydrogen atom, an alkyl group having from 1 to 6 carbon atoms (e.g., a methyl group, an ethyl group, an n-propyl group, an isopropyl group, an n-butyl group, a t-butyl group or an n-hexyl group), a cycloalkyl group having from 5 to 8 carbon atoms (e.g., a cyclopentyl group, a cyclohexyl group or a cyclooctyl group), or a phenyl group.

u, v, w, x and y each represents an integer of from 0 to 15, preferably each represents an integer of from 0 to 10, and particularly preferably each represents an integer of from 0 to 5.

Besides the compounds represented by formulae (C-1), (C-2) and (C-3), amine compounds having an aliphatic hydroxyl group in the molecule and further two or more nitrogen atoms are also preferably used.

The number of ether bonds that the amine compound of component (C1) has in the molecule is preferably from 0 to 30, more preferably from 1 to 20, and particularly preferably from 1 to 10.

The specific examples of the amine compounds having at least one aliphatic hydroxyl group and/or an ether bond in the molecule are shown below, however, the present invention is not limited to these compounds.

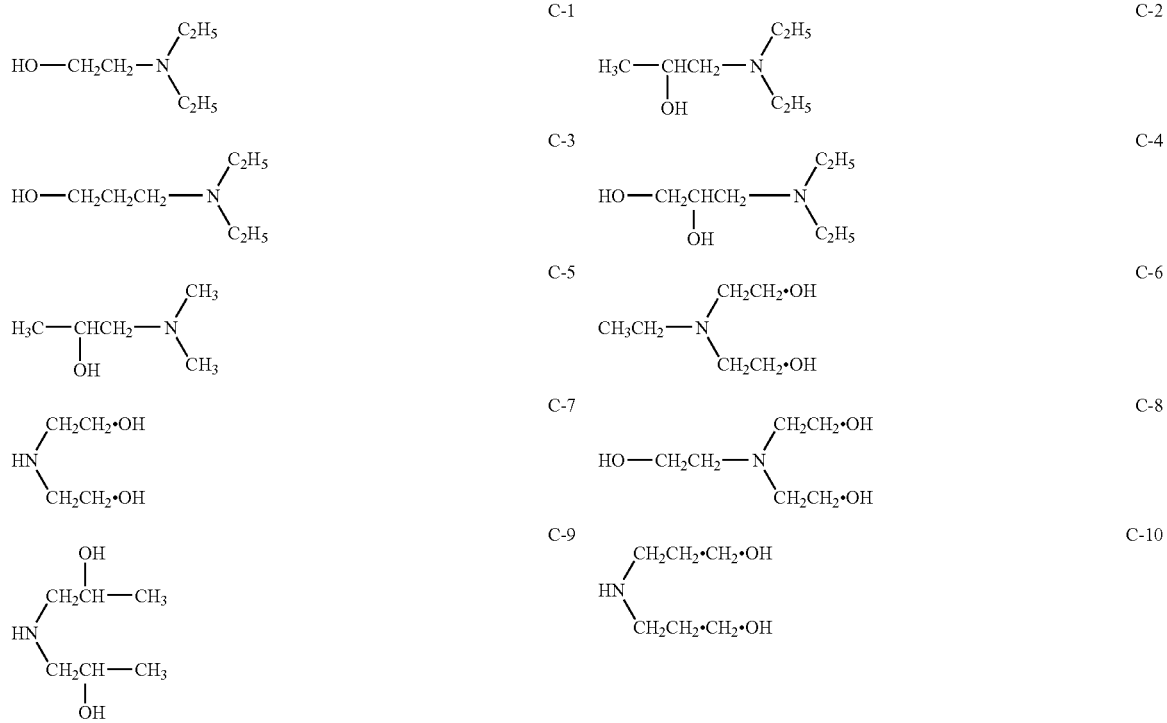

-continued
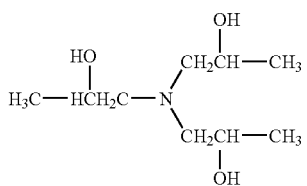
C-11
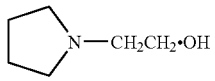
C-12
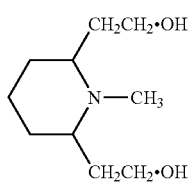
C-13
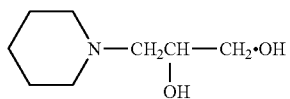
C-14
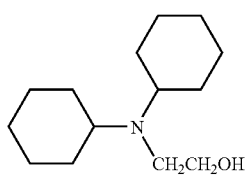
C-15
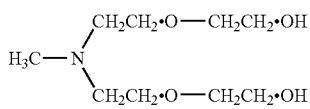
C-16
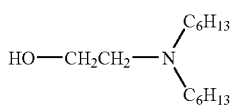
C-17

-continued
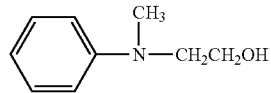
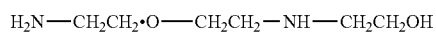
 C-29
 C-30
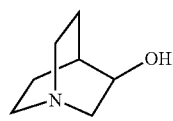
 C-31
 C-32
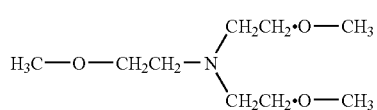
 C-33
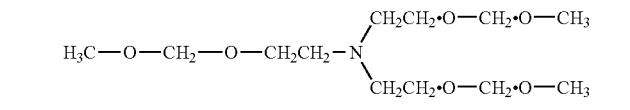 C-34
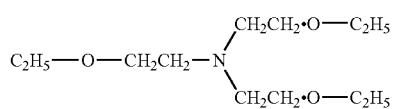
 C-35
 C-36
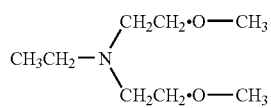
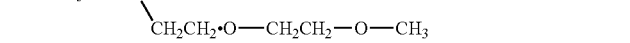 C-37
 C-38
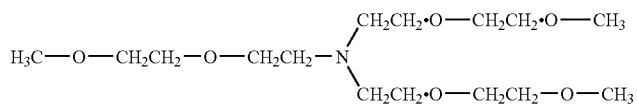 C-39
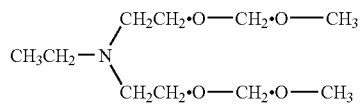
 C-40
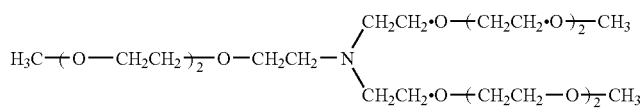 C-41
 C-42
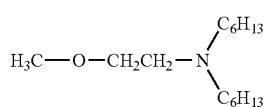
 C-43
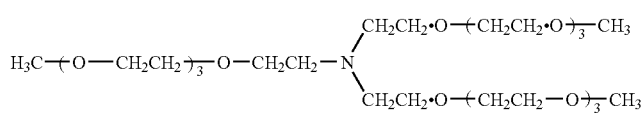 C-44
 C-45
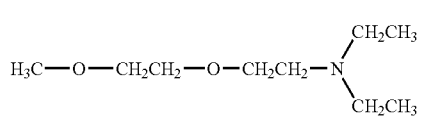
 C-46
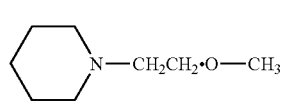
 C-47
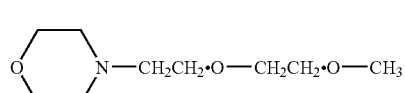 C-48
 C-49
C-50
C-51

-continued

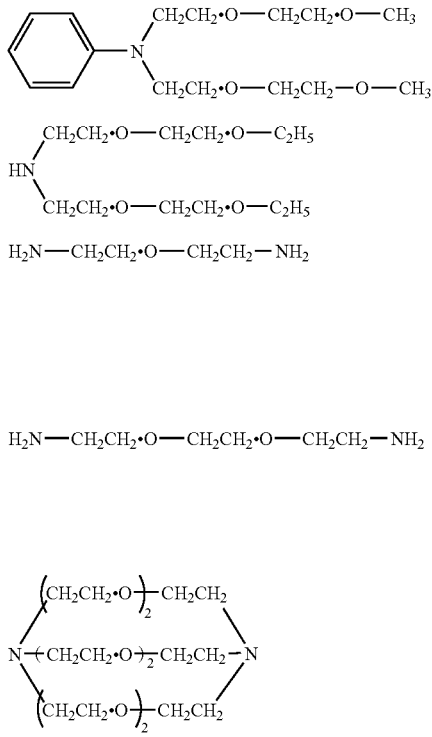

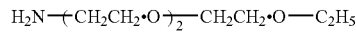

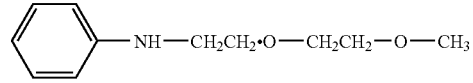

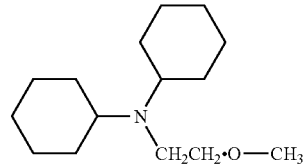

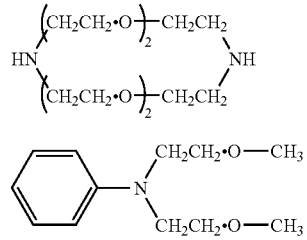

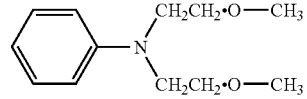

These amine compounds of component (C1) are used alone or in combination of two or more. The use amount of the amine compounds of component (C1) is generally from 0.001 to 10 weight % based on the solids content of the resist composition, and preferably from 0.01 to 5 weight %. When the amine compounds of component (C1) is used in the above range, sufficient effect can be obtained while maintaining sensitivity and developability, and so preferred.

(C2) Other Basic Compounds:

Besides the amine compounds of component (C1), the resist composition according to the invention may contain other amine compounds.

As preferred structures of other amine compounds, the structures represented by the following formulae (A), (B), (C), (D) and (E) are exemplified.

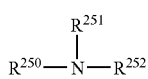

(A)

In formula (A), $R^{250}$, $R^{251}$ and $R^{252}$ each represents a hydrogen atom, an alkyl group having from 1 to 20 carbon atoms, a cycloalkyl group having from 3 to 20 carbon atoms, or an aryl group having from 6 to 20 carbon atoms, and $R^{250}$ and $R^{251}$ may be bonded to each other to form a ring. These alkyl, cycloalkyl and aryl groups may be substituted or unsubstituted. As the alkyl and cycloalkyl groups each having a substituent, an aminoalkyl group having from 1 to 20 carbon atoms, an aminocycloalkyl group having from 3 to 20 carbon atoms, a hydroxyalkyl group having from 1 to 20 carbon atoms, and a hydroxycycloalkyl group having from 3 to 20 carbon atoms are preferred.

An oxygen atom, a sulfur atom and a nitrogen atom may be contained in the alkyl chains.

(B)

(C)

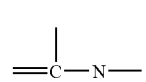

(D)

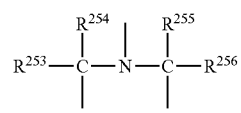

(E)

wherein $R^{253}$, $R^{254}$, $R^{255}$ and $R^{256}$ each represents an alkyl group having from 1 to 6 carbon atoms.

As preferred compounds, substituted or unsubstituted guanidine, substituted or unsubstituted aminopyrrolidine, substituted or unsubstituted pyrazole, substituted or unsubstituted pyrazoline, substituted or unsubstituted piperazine, substituted or unsubstituted aminomorpholine, substituted or unsubstituted aminoalkylmorpholine, and substituted or unsubstituted piperidine can be exemplified. As more preferred compounds, compounds having an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, and aniline derivatives having a hydroxyl group and/or an ether bond can be exemplified.

As compounds having an imidazole structure, 2,4,5-triphenylimidazole and benzimidazole can be exemplified. As compounds having a diazabicyclo structure, 1,4-diazabicyclo-[2,2,2]octane, 1,5-diazabicyclo[4,3,0]nona-5-ene, and 1,8-diazabicyclo[5,4,0]undeca-7-ene can be exemplified. As compounds having an onium hydroxide structure, arylsulfonium hydroxide, phenacylsulfonium hydroxide, sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. Compounds having an onium carboxylate structure are compounds having an onium hydroxide structure in which the anionic part is carboxylated, e.g., acetate, adamantane-1-carboxylate and perfluoroalkyl carboxylate are exemplified. As compounds having a trialkylamine structure, tri(n-butyl)-amine and tri(n-octyl) amine can be exemplified. As aniline compounds, 2,6-diisopropylaniline and N,N-dimethylaniline can be exemplified. As alkylamine derivatives having a hydroxyl group and/or an ether bond, ethanolamine, diethanol-amine, triethanolamine and tris(methoxyethoxyethyl)amine can be exemplified. As aniline derivatives having a hydroxyl group and/or an ether bond, N,N-bis(hydroxyethyl)aniline can be exemplified.

These other basic compounds (C2) are used alone or in combination of two or more. The amount of basic compounds is generally from 0.001 to 10 weight % based on the solids content of the resist composition, and preferably from 0.01 to 5 weight %.

The ratio of the use amount of basic compounds (amine compounds) (C1) to (C2) is preferably from 100/20 to 20/80, more preferably from 100/0 to 40/60, and particularly preferably from 100/50 to 50/50, in a molar ratio of (C1/C2).

[4] Dissolution-Inhibiting Compounds Having a Molecular Weight of 3,000 or Less Which are Capable of Decomposing by the Action of an Acid to Increase the Solubility in an Alkali Developer (Hereinafter Referred to as Component (D) or Dissolution-Inhibiting Compound):

As the dissolution-inhibiting compounds having a molecular weight of 3,000 or less which are capable of decomposing by the action of an acid to increase the solubility in an alkali developer (component (D)), alicyclic or aliphatic compounds containing an acid-decomposable group, such as the cholic acid derivatives containing an acid-decomposable group as described in Proceeding of SPIE, 2724, 355 (1966), are preferred so as not to decrease the penetrability of 220 nm or less. As the acid-decomposable groups and. alicyclic structures, the same groups and structures as described in the alicyclic hydrocarbon acid-decomposable resins are exemplified.

When the positive resist composition according to the invention is subjected to exposure with KrF excimer lasers or irradiated with electron beams, phenolic compounds having a structure that the phenolic hydroxyl group is substituted with an acid-decomposable group are preferred. As the phenolic compounds, compounds containing from 1 to 9 phenolic skeletons are preferred, more preferably those containing from 2 to 6 phenolic skeletons.

The dissolution-inhibiting compounds in the invention have a molecular weight of 3,000 or less, preferably from 300 to 3,000, and still more preferably from 500 to 2,500.

The addition amount of dissolution-inhibiting compounds is preferably from 3 to 50 weight % based on the solids content of the resist composition, and more preferably from 5 to 40 weight %.

The specific examples of dissolution-inhibiting compounds are shown below but the present invention is not limited thereto.

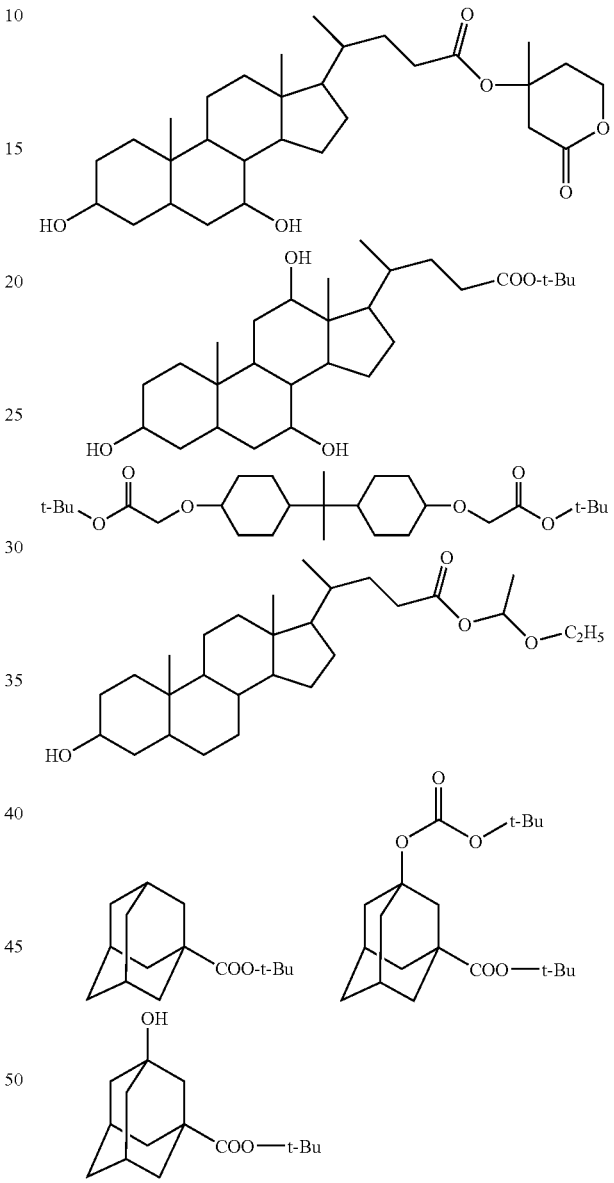

[5] Fluorine and/or Silicon Surfactants (Component E):

It is preferred for the positive resist composition in the invention to further have either one or two or more of a fluorine and/or silicon surfactant (a fluorine surfactant and a silicon surfactant, a surfactant containing both a fluorine atom and a silicon atom).

By containing a fluorine and/or silicon surfactant, it becomes possible for the positive resist in the invention to provide a resist pattern excellent in sensitivity, resolution and adhesion, and low in development failure in using an exposure light source of 250 nm or lower, particularly 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. Commercially available surfactants as shown below can also be used as they are.

As usable commercially available surfactants, fluorine surfactants and silicon surfactants, e.g., EFTOP EF301 and Ef303 (manufactured by Shin Akita Kasei Co., Ltd.), Fluorad FC430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by Asahi Glass Co., Ltd.), and Toroy Sol S-366 (manufactured by Toroy Chemical Co., Ltd.) can be exemplified. Polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and poly(oxyalkylene) acrylate and/or poly(oxyalkylene) methacrylate are preferred, and these polymers may be irregularly distributed or may be block copolymerized. As the poly(oxyalkylene) groups, a poly(oxyethylene) group, a poly(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more fluoro-aliphatic groups or different two or more poly(oxyalkylene) acrylates (or methacrylates) at the same time.

For example, as commercially available surfactants, Megafac F-178, F-470, F-473, F-475, F-476, F-472 (manufactured by Dainippon Ink and Chemicals Inc.) can be exemplified. Further, copolymers of acrylate (or methacrylate) having a $C_6F_{13}$ group and poly(oxyalkylene) acrylate (or methacrylate), copolymers of acrylate (or methacrylate) having a $C_6F_{13}$ group and poly(oxyethylene) acrylate (or methacrylate) and poly(oxypropylene) acrylate (or methacrylate), copolymers of acrylate (or methacrylate) having a $C_8F_{17}$ group and poly (oxy-alkylene) acrylate (or methacrylate), and copolymers of acrylate (or methacrylate) having a $C_8F_{17}$ group and poly(oxy-ethylene) acrylate (or methacrylate) and poly(oxypropylene) acrylate (or methacrylate) are exemplified.

The amount of fluorine and/or silicon surfactants is preferably from 0.0001 to 2 weight % based on the total amount of the positive resist composition (excluding solvents), more preferably from 0.001 to 1 weight %.

[6] Organic Solvents (Component (F))

For using the positive resist composition in the invention, the above components are dissolved in a prescribed organic solvent.

As the organic solvents that can be used, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

Organic solvents may be used alone or as mixture, but it is preferred in the invention to use a mixed solvent of a solvent containing a hydroxyl group in the structure and a solvent not containing a hydroxyl group, by which the generation of particles can be reduced in storing a resist solution.

As solvents containing a hydroxyl group, e.g., ethylene glycol, ethylene glycol monomethyl ether, ethylene glycol monoethyl ether, propylene glycol, propylene glycol monomethyl ether, propylene glycol monoethyl ether and ethyl lactate are exemplified. Of these solvents, propylene glycol monomethyl ether and ethyl lactate are particularly preferred.

As solvents not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide are exemplified. Of these solvents, propylene glycol monomethyl ether acetate, ethylethoxy propionate, 2-heptanone, γ-butyrolactone, cyclohexanone and butyl acetate are particularly preferred, and propylene glycol monomethyl ether acetate, ethylethoxy propionate and 2-heptanone are most preferred.

The mixing ratio (by weight) of a solvent containing a hydroxyl group and a solvent not containing a hydroxyl group is from 1/99 to 99/1, preferably from 10/90 to 90/10, and more preferably from 20/80 to 60/40. A mixed solvent containing 50 weight % or more of a solvent not containing a hydroxyl group is particularly preferred in the point of coating uniformity.

Other Additives:

If necessary, dyes, plasticizers, surfactants other than the surfactants of component (E), photosensitizers, and compounds for accelerating dissolution in a developer may be further added to the positive resist composition in the present invention.

Compounds for accelerating dissolution in a developer usable in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 weight % based on the addition amount of the resin of component (A), more preferably from 5 to 30 weight %. The amount is preferably 50 weight % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the present invention is not limited to these compounds.

Surfactants other than fluorine and/or silicon surfactants of component (E) can be used in the invention. As the specific examples of other surfactants, nonionic surfactants, e.g., polyoxyethylene alkyl ethers, polyoxyethylene alkylaryl ethers, polyoxyethylene-polyoxypropylene block copolymers, sorbitan aliphatic acid esters, and polyoxyethylene sorbitan aliphatic acid esters can be exemplified.

These surfactants may be used alone or in combination of two or more.

Directions For Use:

The positive resist composition in the invention is used by dissolving each of the above components in a prescribed organic solvent, preferably dissolving in a mixed solvent as described above, and coating the solution on a prescribed support as follows.

For example, the positive resist composition is coated on a substrate such as the one used in the manufacture of precision integrated circuit element (e.g., silicon/silicon dioxide coating) by an appropriate coating method with a spinner or a coater, and dried, to thereby form a resist layer.

The resist layer is irradiated with an actinic ray or radiation through a prescribed mask, the exposed resist layer is subjected to baking (heating), and then development. Thus, a good pattern can be obtained.

As actinic rays or radiation, infrared rays, visible rays, ultraviolet rays, far ultraviolet rays, X-rays and electron beams can be exemplified, and preferably far ultraviolet rays of wavelength of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and ArF excimer lasers, $F_2$ excimer lasers and EUV (13 nm) are preferred.

In a development process, an alkali developer is used as follows. As alkali developers of the resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

The alkali concentration of alkali developers is generally from 0.1 to 20 weight %.

The pH of alkali developers is generally from 10.0 to 15.0.

EXAMPLE

The present invention is described in detail with reference to examples but the invention is not limited thereto.

Synthesis Example

Synthesis of Resin (21)

A mixture comprising norbornene carboxylic acid t-Bu ester, norbornene carboxylic acid, norbornene carboxylic acid 2-hydroxyethyl ester and maleic anhydride is dissolved in tetrahydrofuran to prepare a solution having a solids content of 50%. The solution was put into a three-necked flask and heated at 60° C. under a nitrogen current. When the reaction temperature was stabilized, a radical polymerization initiator V-60 (manufactured by Wako Pure Chemical Co., Ltd.) was added to the reaction solution in an amount of 5 mol % and reaction was initiated. After heating for 6 hours, the reaction mixture was diluted with tetrahydrofuran by two times, and then the reaction mixture was put into hexane five times the volume of the reaction mixture to precipitate white powder. The white powder was dissolved in THF and the solution was again put into hexane five times the volume of the solution to precipitate white powder. The precipitated powder was recovered by filtration and dried, thereby objective resin (21) (formula (1) in JP-A-2000-241964) was obtained.

It was found the molecular weight of the obtained resin (21) was 7,900 (weight average) in terms of polystyrene from the molecular weight analysis (RI analysis) by GPC.

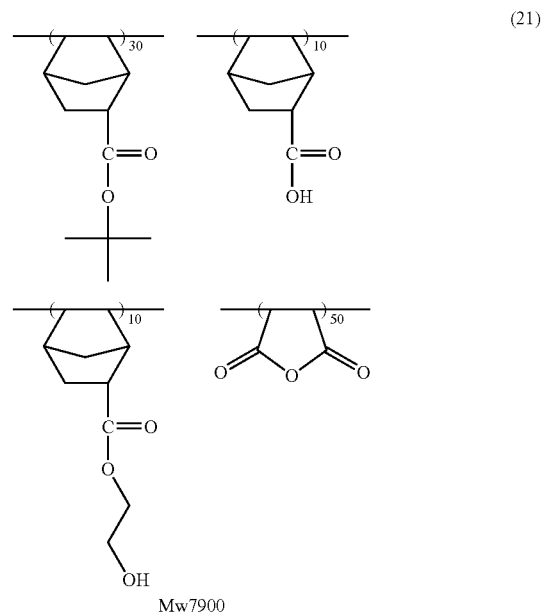

(21)

The following resins (1) to (20) were obtained in the same manner as above.

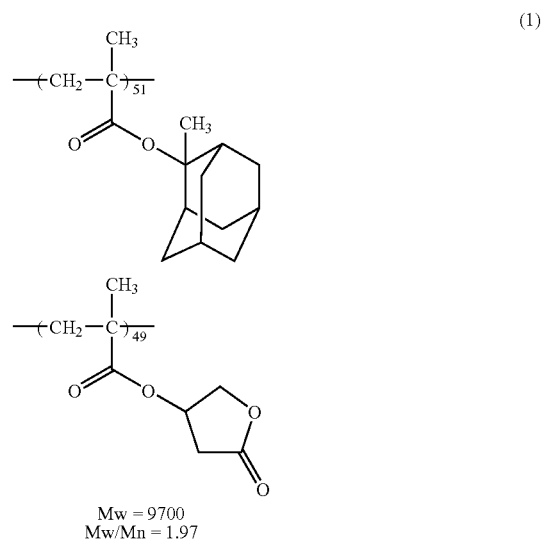

(1)

-continued
(2)
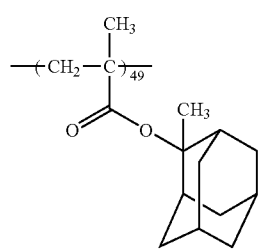 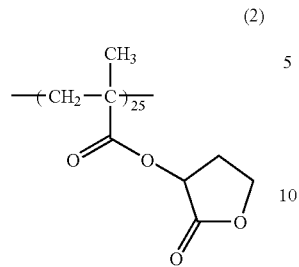
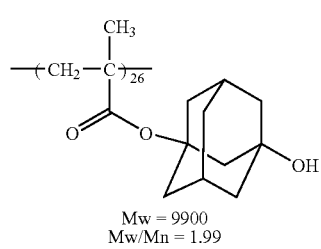
Mw = 9900
Mw/Mn = 1.99
(3)
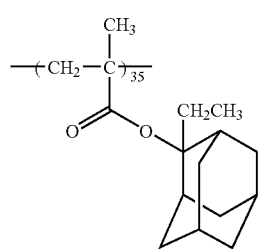
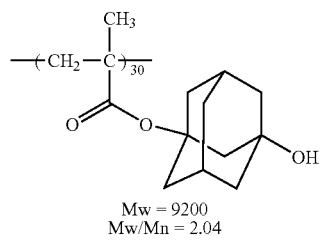
Mw = 9200
Mw/Mn = 2.04
(4)
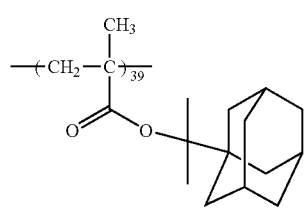
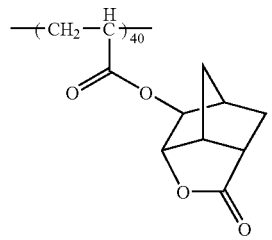
-continued
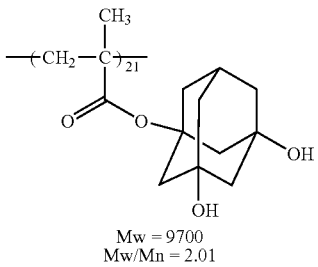
Mw = 9700
Mw/Mn = 2.01
(5)
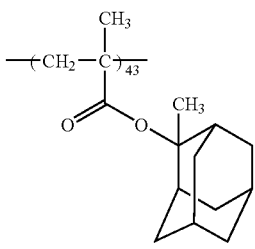
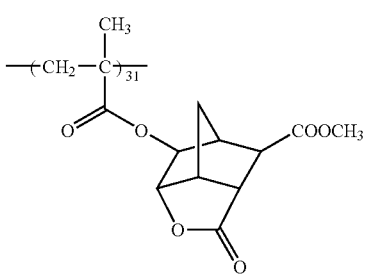
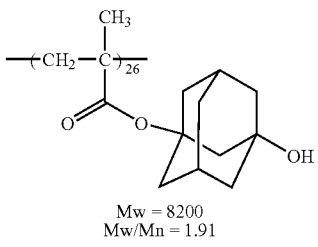
Mw = 8200
Mw/Mn = 1.91
(6)
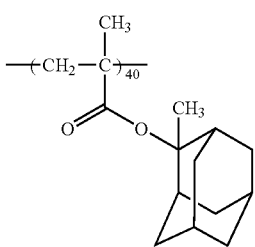
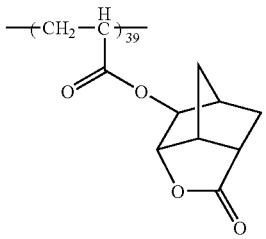

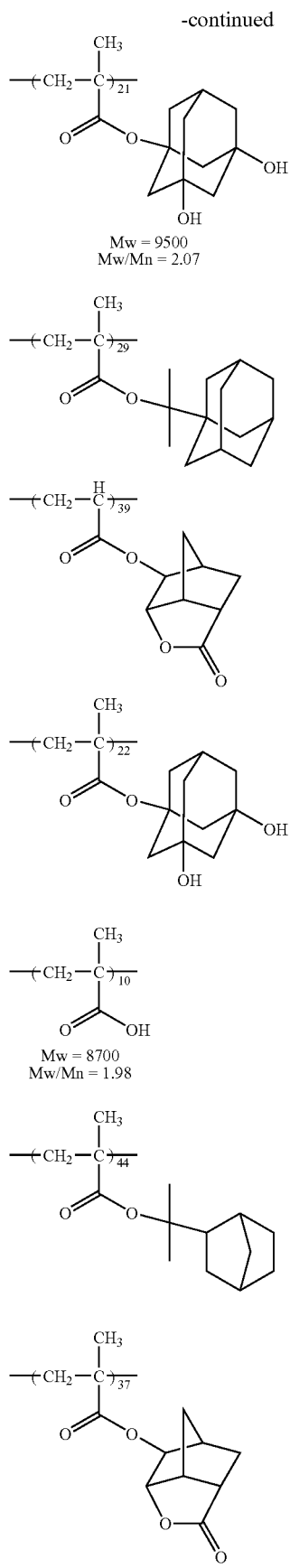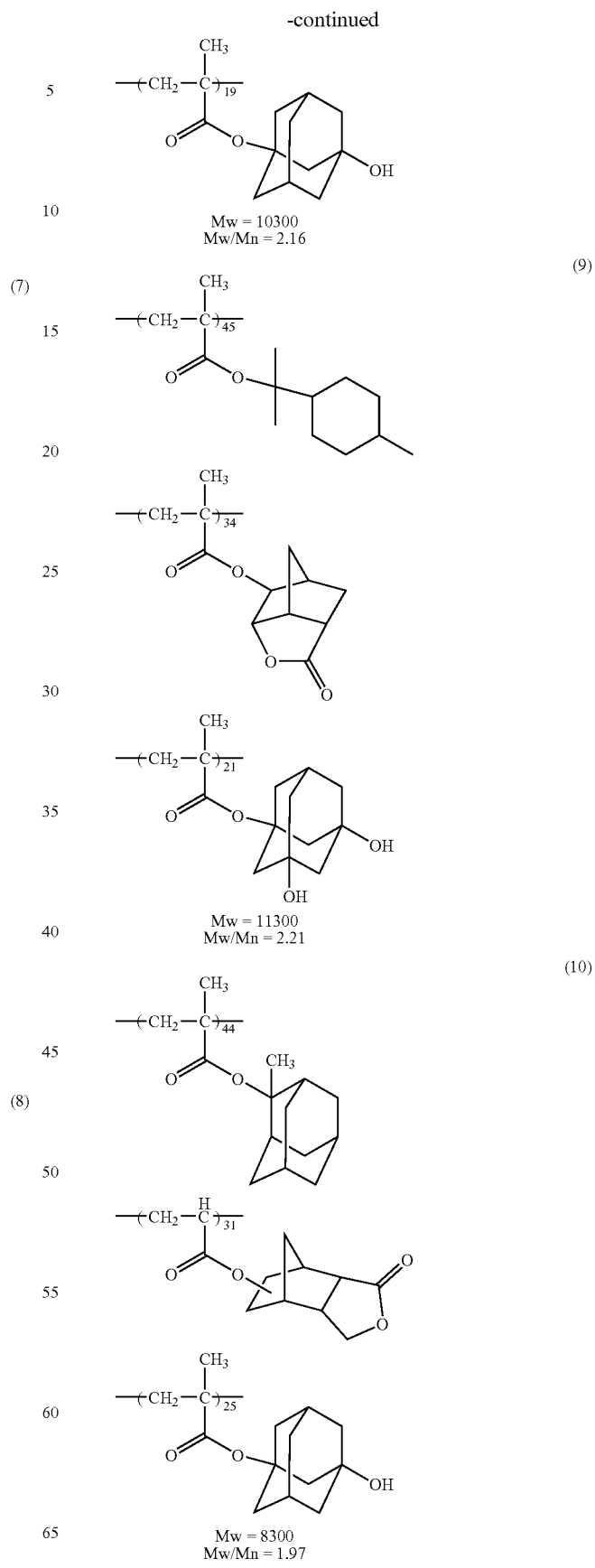

-continued
(11)
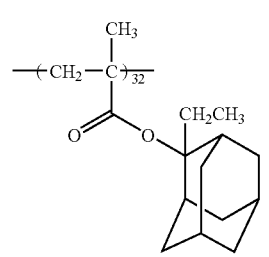
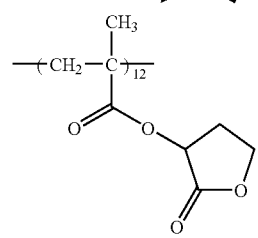
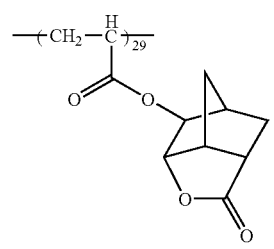
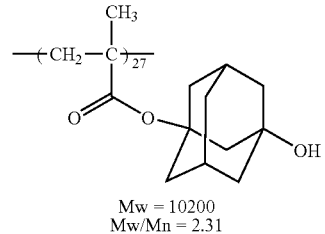
Mw = 10200
Mw/Mn = 2.31
(12)
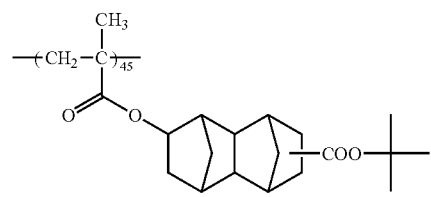
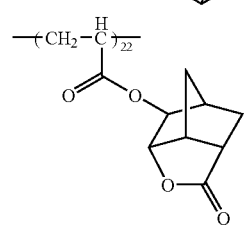
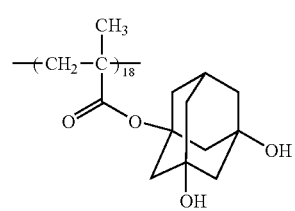
-continued
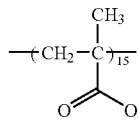
Mw = 8700
Mw/Mn = 2.23
(13)
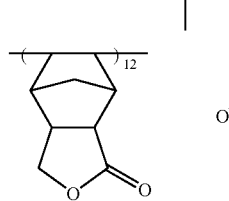
Mw = 7100
Mw/Mn = 2.42
(14)
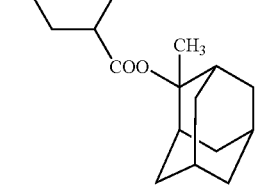
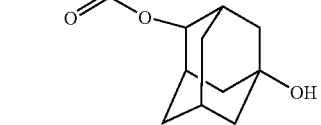
Mw = 8900
Mw/Mn = 2.19
(15)
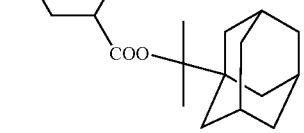
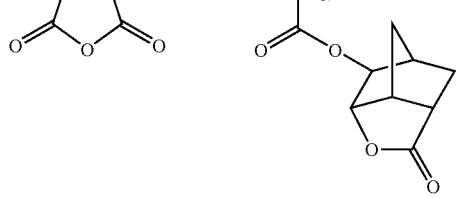

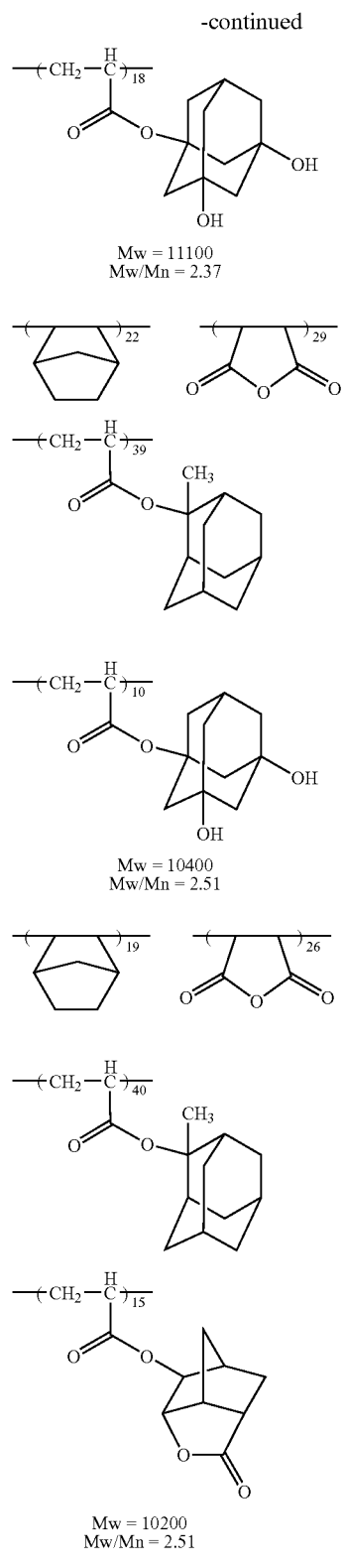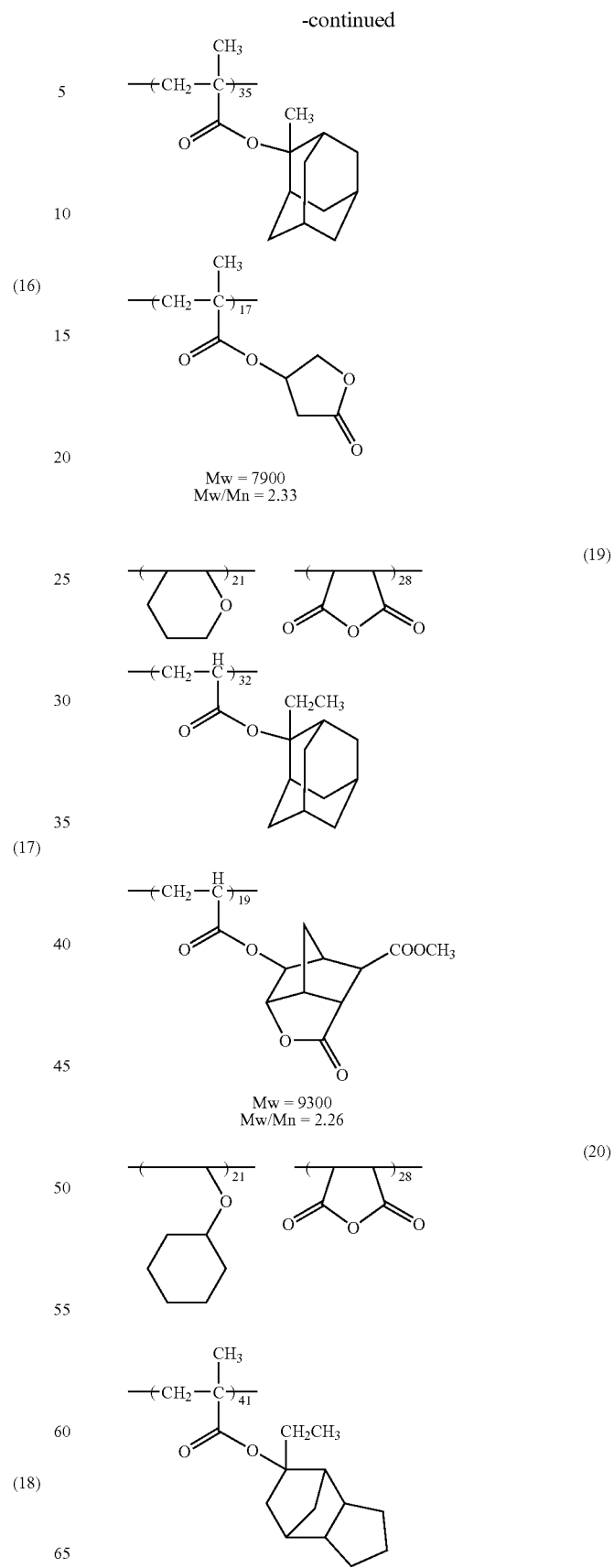

-continued

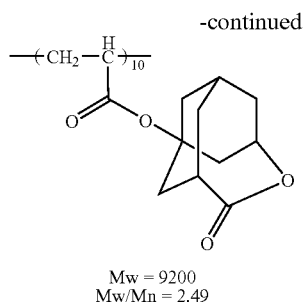

Mw = 9200
Mw/Mn = 2.49

Examples 1 to 40 and Comparative Examples 1 to 6

Preparation of Resists:

The components of each sample shown in Tables 1 and 2 below were dissolved in a solvent to prepare a solution having solids content concentration of 10 weight %, and each solution was filtered through a polyethylene filter having a pore diameter of 0.1 μm, thereby a positive resist solution was obtained. The thus prepared positive resist solution was evaluated by the following method. The results obtained are shown in Tables 1 and 2. In comparative examples, samples in which the acid-generating agent of component (B1) and the amine compound of component (C) were not used were shown.

Evaluation of Resist:

A reflection-preventing layer was formed by uniformly coating ARC29A (manufactured by Brewer Science) on a silicon wafer by a spin coater in a thickness of 78 nm, drying by heating at 205° C. for 60 seconds. After that, each positive resist composition just after preparation was coated thereon by a spin coater and dried at 120° C. for 90 seconds (PB), thereby forming a resist layer having a thickness of 300 nm.

Each resist layer was subjected to exposure through a mask with an ArF excimer laser stepper (manufactured by ASML Co., PAS5500/1100, NA=0.75 (⅔ zonal illumination)), immediately after exposure, heated on a hot plate at three kinds of temperatures of 117° C., 120° C. and 123° C. for 90 seconds (PEB), and developed with a 2.38 weight % tetramethylammonium hydroxide aqueous solution at 23° C. for 60 seconds, rinsed with pure water for 30 seconds and dried. Thus, a resist pattern was obtained. The obtained pattern was evaluated by the following method.

Resolution:

The resist pattern was observed by using a scanning electron microscope (S-9260, manufactured by Hitachi Ltd.) from the surface. The critical resolution (resolution of separation of line and space) at exposure amount necessary to resolve a 100 nm line (line/space=1/1) was taken as resolution.

Margin of Exposure Amount:

In the higher and lower exposure amounts with the above exposure amount as center, the range of exposure amount (%) that the line width comes in the range of objective value (100 nm) ±10% was taken as the margin of exposure amount. The greater the numerical value, the better is the margin of exposure amount.

PEB Temperature Dependency:

In the above exposure amount, line widths at three points of PEB temperatures were measured, and the change of line width per 1° C. of PEB temperature was taken as PEB temperature dependency. The smaller the numerical value, the better is the PEB temperature dependency.

TABLE 1

| Ex. No. | (A) Resin (2 g) | (B1) Acid-Generating Agent (mg) | (B2) Acid-Generating Agent (mg) | (C1) Amine Cpd. (mg) | (C2) Amine Cpd. (mg) | (D) Dissolution Inhibiting Cpd. (0.1 g) | (E) Surfactant (5 mg) | Solvent (weight ratio) | Resolution (nm) | Margin of Exposure Amount (%) | PEB Temp. Dependency (nm/° C.) |
|---|---|---|---|---|---|---|---|---|---|---|---|
| Ex. 1 | 1 | I-1 (20) | Z1 (20) | C-1 (5) | — | — | W1 | S2/S4 (60/40) | 85 | 15 | 2.9 |
| Ex. 2 | 2 | I-1 (30) | Z1 (10) | C-3 (3) | N-1 (2) | — | W1 | S2/S5 (90/10) | 90 | 16.5 | 3.2 |
| Ex. 3 | 3 | I-2 (20) | Z2 (20) | C-4 (3) | N-2 (2) | — | W1 | S2/S1 (80/20) | 90 | 15 | 2.4 |
| Ex. 4 | 4 | I-3 (25) | Z3 (15) | C-8 (5) | — | — | W1 | S2 (100) | 80 | 14.5 | 2.6 |
| Ex. 5 | 5 | I-1 (30) | Z15 (15) | C-11 (5) | — | — | W1 | S2/S4 (50/50) | 80 | 14 | 2.1 |
| Ex. 6 | 6 | I-3 (20) | Z2 (20) | C-12 (4) | — | — | W2 | S2/S3 (80/20) | 85 | 15.5 | 3.2 |
| Ex. 7 | 7 | I-7 (40) | — | C-13 (4) | — | — | W2 | S2/S4 (50/50) | 85 | 17.5 | 3.4 |
| Ex. 8 | 8 | I-1 (25) | Z13 (20) | C-14 (4) | — | — | W3 | S2 (100) | 85 | 16 | 2.5 |
| Ex. 9 | 9 | I-2 (20) | Z16 (20) | C-17 (3) | N-3 (2) | — | W4 | S2/S4 (40/60) | 85 | 17 | 2.0 |
| Ex. 10 | 10 | I-7 (20) | Z13 (25) | C-20 (5) | N-2 (1) | — | W1 | S2/S4 (40/60) | 90 | 18.5 | 2.5 |
| Ex. 11 | 11 | I-5 (20) | Z14 (30) | C-21 (6) | — | — | W2 | S2 (100) | 85 | 16 | 2.3 |
| Ex. 12 | 12 | I-21 (20) | Z36 (20) | C-25 (3) | N-2 (1) | — | W3 | S2/S5 (50/50) | 80 | 16 | 2.2 |
| Ex. 13 | 13 | I-2 (20) | Z37 (20) | C-26 (3) | — | — | W4 | S3/S5 (80/20) | 90 | 17 | 2.2 |
| Ex. 14 | 14 | I-2 (25) | Z32 (25) | C-28 (6) | — | — | W1 | S4 (100) | 85 | 14.5 | 3.1 |
| Ex. 15 | 15 | I-1 (40) | Z1 (10) | C-29 (3) | N-1 (2) | — | W2 | S2/S4 (80/20) | 80 | 16.5 | 2.8 |
| Ex. 16 | 16 | I-1 (45) | — | C-30 (4) | — | — | W3 | S2 (100) | 85 | 16 | 3.0 |
| Ex. 17 | 17 | I-2 (30) | Z40 (15) | C-33 (3) | — | — | W3 | S3 (100) | 85 | 15.5 | 2.5 |
| Ex. 18 | 18 | I-3 (20) | Z1 (20) | C-34 (3) | — | — | W1 | S2/S1 (70/30) | 80 | 15 | 2.6 |
| Ex. 19 | 19 | I-2 (20) | Z2 (20) | C-18 (4) | — | 1-1 | W4 | S2/S3 (70/30) | 90 | 16.5 | 2.8 |
| Ex. 20 | 20 | I-1 (20) | Z12 (20) | C-6 (4) | — | 1-2 | W2 | S2/S4 (40/60) | 85 | 15.5 | 3.0 |
| Comp. Ex. 1 | 1 | — | Z1 (40) | C-1 (5) | — | — | W1 | S2/S4 (60/40) | 95 | 10.0 | 6.0 |
| Comp. Ex. 2 | 2 | I-1 (30) | Z1 (10) | — | N-2 (5) | — | W1 | S2/S5 (90/10) | 100 | 9 | 5.9 |
| Comp. Ex. 3 | 3 | — | Z2 (40) | — | N-2 (5) | — | W1 | S2/S1 (80/20) | 100 | 9.5 | 7.0 |

TABLE 2

| Ex. No. | (A) Resin (2 g) | (B1) Acid-Generating Agent (mg) | (B2) Acid-Generating Agent (mg) | (C1) Amine Cpd. (mg) | (C2) Amine Cpd. (mg) | (D) Dissolution Inhibiting Cpd. (g) | (E) Surfactant (5 mg) | Solvent (weight ratio) | Resolution (nm) | Margin of Exposure Amount (%) | PEB Temp. Dependency (nm/° C.) |
|---|---|---|---|---|---|---|---|---|---|---|---|
| Ex. 21 | 1 | I-1 (35) | Z1 (15) | C-35 (4) | — | — | W1 | S2/S4 (60/40) | 85 | 16 | 3.2 |
| Ex. 22 | 2 | I-1 (20) | Z2 (20) | C-36 (3) | N-2 (1) | — | W1 | S2/S5 (95/5) | 80 | 14 | 2.5 |
| Ex. 23 | 3 | I-2 (20) | Z1 (20) | C-43 (5) | N-3 (2) | — | W1 | S2/S1 (70/30) | 80 | 15.5 | 2.2 |
| Ex. 24 | 4 | I-3 (23) | Z3 (25) | C-45 (7) | — | — | W2 | S2 (100) | 90 | 13 | 3.9 |
| Ex. 25 | 5 | I-1 (19) | Z1 (20) | C-38 (4) | N-1 (1) | — | W2 | S2/S4 (50/50) | 85 | 14 | 3.1 |
| Ex. 26 | 6 | I-3 (20) | Z2 (20) | C-52 (3) | — | — | W3 | S2/S3 (80/20) | 80 | 13.5 | 2.7 |
| Ex. 27 | 7 | I-7 (40) | — | C-53 (3) | — | — | W4 | S2/S4 (50/50) | 85 | 18 | 3.4 |
| Ex. 28 | 8 | I-1 (25) | Z14 (20) | C-40 (4) | N-3 (2) | — | W4 | S2/S1 (70/30) | 80 | 15 | 3.1 |
| Ex. 29 | 9 | I-2 (20) | Z16 (25) | C-54 (4) | — | — | W2 | S2/S4 (40/60) | 90 | 18 | 2.4 |
| Ex. 30 | 10 | I-7 (25) | Z13 (20) | C-58 (5) | — | — | W1 | S2/S4 (40/60) | 85 | 14.5 | 1.9 |
| Ex. 31 | 11 | I-5 (30) | Z1 (20) | C-40 (6) | — | — | W1 | S2/S5 (75/25) | 85 | 16 | 3.0 |
| Ex. 32 | 12 | I-21 (20) | Z36 (20) | C-42 (5) | — | — | W3 | S2/S5 (50/50) | 85 | 15.5 | 3.2 |
| Ex. 33 | 13 | I-2 (18) | Z40 (30) | C-46 (2) | N-1 (2) | 1-1 (0.1) | W3 | S3/S5 (80/20) | 90 | 18 | 2.5 |
| Ex. 34 | 14 | I-2 (25) | Z37 (35) | C-47 (4) | — | — | W4 | S2/S4 (80/20) | 80 | 14.5 | 3.0 |
| Ex. 35 | 15 | I-1 (30) | Z2 (33) | C-59 (5) | — | — | W4 | S2/S4 (80/20) | 85 | 15 | 3.3 |
| Ex. 36 | 16 | I-1 (40) | Z15 (10) | C-61 (4) | — | — | W2 | S2 (100) | 85 | 14 | 2.7 |
| Ex. 37 | 17 | I-2 (50) | — | C-50 (4) | — | 1-2 (0.1) | W2 | S3 (100) | 80 | 14 | 2.4 |
| Ex. 38 | 18 | I-3 (20) | Z13 (20) | C-61 (3) | N-2 (3) | — | W3 | S2/S1 (70/30) | 80 | 15.5 | 3.4 |
| Ex. 39 | 19 | I-2 (25) | Z12 (15) | C-38 (4) | — | — | W1 | S2/S3 (70/30) | 85 | 16 | 3.0 |
| Ex. 40 | 20 | I-1 (25) | Z2 (20) | C-43 (7) | — | — | W3 | S2/S4 (40/60) | 85 | 15 | 2.9 |
| Comp. Ex. 4 | 1 | — | Z1 (50) | C-35 (4) | — | — | W1 | S2/S4 (60/40) | 95 | 10.5 | 5.2 |
| Comp. Ex. 5 | 2 | I-1 (20) | Z2 (20) | — | N-2 (4) | — | W1 | S2/S5 (95/5) | 90 | 9.5 | 6.1 |
| Comp. Ex. 6 | 3 | — | Z1 (40) | — | N-3 (5) | — | W1 | S2/S1 (70/30) | 100 | 9 | 7.5 |

The abbreviations of the resins and acid-generating agents in the above Tables 1 and 2 are the same as the aforementioned, and others are as follows.

W1: Megafac F176 (fluorine surfactant, manufactured by Dainippon Ink and Chemicals Inc.)
W2: Megafac R$_{08}$ (fluorine and silicon surfactant, manufactured by Dainippon Ink and Chemicals Inc.)
W3: Polysiloxane polymer KP-341 (silicon surfactant, manufactured by Shin-Etsu Chemical Co., Ltd.)
W4: Toroy Sol S-366 (manufactured by Toroy Chemical Co., Ltd.)
S1: Cyclohexanone
S2: Propylene glycol monomethyl ether acetate
S3: Ethyl lactate
S4: Propylene glycol monomethyl ether
S5: 2-Heptanone
I-1: t-Butyl lithocholate
I-2: t-Butyl adamantanecarboxylate
N-1: N,N-Dibutylaniline
N-2: 2,4,5-Triphenylimidazole
N-3: 2,6-Diisopropylaniline When solvents are used in plurality, the ratio is the ratio by weight.

It is known from the results in Tables 1 and 2 that the resist compositions according to the present invention are high in resolution and also excellent in the margin of exposure amount and PEB temperature dependency as compared with the compositions in comparative examples.

The present invention is not limited to the specific above-described embodiments. It is contemplated that numerous modifications may be made to the present invention without departing from the spirit and scope of the invention as defined in the following claims.

What is claimed is:

1. A positive resist composition comprising:
(A) a resin capable of increasing a solubility thereof in an alkali developer by an action of an acid, the resin containing a repeating unit having a group having a lactone structure;
(B) a compound capable of generating a sulfonic acid represented by the following formula (I) upon irradiation with one of an actinic ray and a radiation; and
(C1) at least one of an amine compound having at least an aliphatic hydroxyl group in a molecule and an amine compound having at least an ether bond in a molecule:

$$A_1\text{-}(A_2\text{-}SO_3H)_n \qquad (I)$$

wherein $A_1$ represents an n-valent linking group, $A_2$ represents a divalent aliphatic group, and $A_2$'s each may be the same or different, provided that at least one group represented by $A_1$ or $A_2$ contains a fluorine atom, and n represents an integer of from 2 to 4.

2. The positive resist composition according to claim 1, wherein $A_2$ is an aliphatic group having a structure represented by the following formula (II):

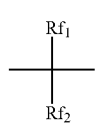

(II)

wherein $Rf_1$ and $Rf_2$ each independently represents a hydrogen atom, a halogen atom, an alkyl group or a cycloalkyl group, provided that at least one of $Rf_1$ and $Rf_2$ represents a fluorine atom or a fluoroalkyl group.

3. The positive resist composition according to claim 1, wherein the component (B) is a compound selected from a sulfonium salt compound, an iodonium salt compound and an ester compound of the sulfonic acid represented by the formula (I).

4. The positive resist composition according to claim 1, wherein the amine compound of the component (C1) is at least a compound selected from structures represented by the following formulae (C-1), (C-2) and (C-3):

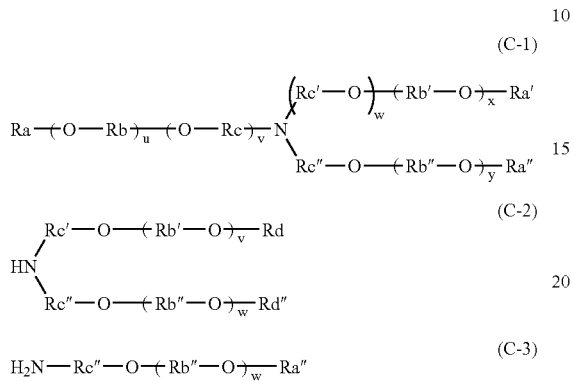

wherein Ra, Ra' and Ra" each independently represents a hydrogen atom, an alkyl group, a cycloalkyl group or an aryl group; Rb, Rb', Rb", Rc, Rc' and Rc" each may be the same or different in a case where a plurality of Rb, Rb', Rb", Rc, Rc' and Rc are present, and each independently represents an alkylene group; Rd and Rd" each independently represents a hydrogen atom, an alkyl group, a cycloalkyl group or an aryl group; and u, v, w, x and y each independently represents an integer of from 0 to 15.

5. The positive resist composition according to claim 1, further comprising a surfactant.

6. A pattern-forming method comprising: forming a film from the positive resist composition according to claim 1; exposing the film; and developing the exposed film.

7. The positive resist composition according to claim 1, wherein the component (A) is a resin having at least one repeating unit selected from the group consisting of a repeating unit having a partial structure containing an alicyclic hydrocarbon represented by any of formulae (pI) to (pVI) and a repeating unit represented by formula (II-AB):

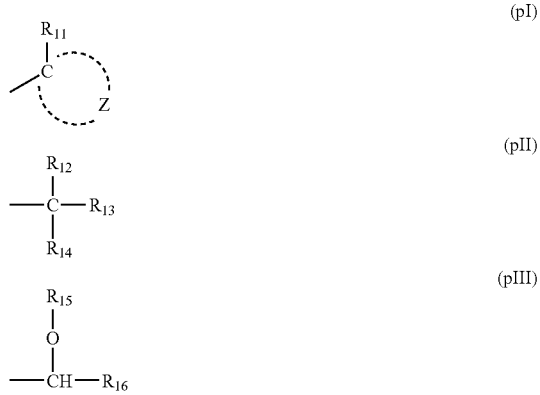

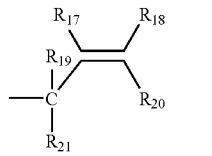

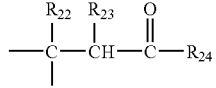

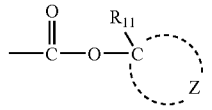

wherein $R_{11}$ represents a methyl group, an ethyl group, an n-propyl group, an isopropyl group, an n-butyl group, an isobutyl group or a sec-butyl group;

Z represents an atomic group necessary to form an alicyclic hydrocarbon group together with a carbon atom;

$R_{12}$, $R_{13}$, $R_{14}$, $R_{15}$ and $R_{16}$ each independently represents a straight chain or a branched alkyl group having from 1 to 4 carbon atoms, or an alicyclic hydrocarbon group, provided that at least one of $R_{12}$, $R_{13}$ and $R_{14}$, or either $R_{15}$ or $R_{16}$, represents an alicyclic hydrocarbon group;

$R_{17}$, $R_{18}$, $R_{19}$, $R_{20}$ and $R_{21}$ each independently represents a hydrogen atom, a straight chain or a branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or a branched alkyl group having from 1 to 4 carbon atoms, or an alicyclic hydrocarbon group; and $R_{22}$, $R_{23}$, $R_{24}$ and $R_{25}$ each independently represents a hydrogen atom, a straight chain or a branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring:

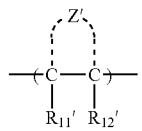

wherein $R_{11}'$ and $R_{12}'$ each independently represents a hydrogen atom, a cyano group, a halogen atom or an alkyl group; and Z' contains at least two bonded carbon atoms (C—C) and represents an atomic group necessary to form an alicyclic structure.

8. The positive resist composition according to claim 1, wherein the repeating unit having a group having a lactone structure of the component (A) is a repeating unit having a group having a lactone structure represented by formula (Lc) or any of formulae (V-1) to (V-5):

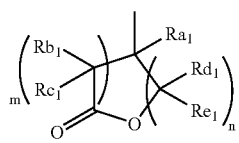
(Lc)

wherein $R_{a1}$, $R_{b1}$, $R_{c1}$, $R_{d1}$ and $R_{e1}$ each independently represents a hydrogen atom or an alkyl group;

m and n each independently represents an integer of from 0 to 3; and m+n is from 2 to 6|

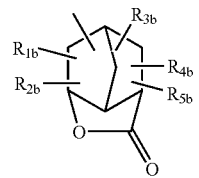
(V-1)

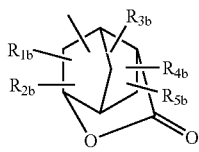
(V-2)

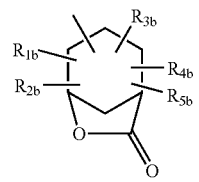
(V-3)

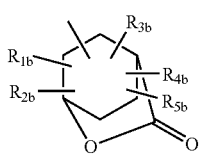
(V-4)

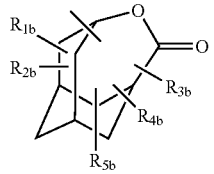
(V-5)

wherein $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group, an alkenyl group, or —COOR$_a$;

$R_a$ represents an alkyl group; and two of $R_{1b}$ to $R_{5b}$ may be bonded to each other to form a ring.

9. The positive resist composition according to claim 1, wherein the resin (A) further contains a repeating unit represented by formula (VIII):

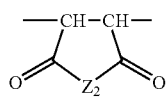
(VIII)

wherein $Z_2$ represents —O— or —N(R$_{41}$)—;

$R_{41}$ represents a hydrogen atom, a hydroxyl group, an alkyl group or —OSO$_2$—R$_{42}$; and $R_{42}$ represents an alkyl group, a cycloalkyl group or a camphor residue, and the alkyl group represented by $R_{41}$ and $R_{42}$ may be substituted with a halogen atom.

* * * * *